US009217921B2

(12) United States Patent
Kanno et al.

(10) Patent No.: US 9,217,921 B2
(45) Date of Patent: Dec. 22, 2015

(54) RESIST UNDERLAYER FILM FORMING COMPOSITION CONTAINING SILICON HAVING SULFIDE BOND

(75) Inventors: Yuta Kanno, Toyama (JP); Makoto Nakajima, Toyama (JP); Wataru Shibayama, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 216 days.

(21) Appl. No.: 13/375,517

(22) PCT Filed: May 28, 2010

(86) PCT No.: PCT/JP2010/059117
§ 371 (c)(1),
(2), (4) Date: Dec. 1, 2011

(87) PCT Pub. No.: WO2010/140551
PCT Pub. Date: Dec. 9, 2010

(65) Prior Publication Data
US 2012/0070994 A1 Mar. 22, 2012

(30) Foreign Application Priority Data
Jun. 2, 2009 (JP) ................................. 2009-133189

(51) Int. Cl.
H01L 21/312 (2006.01)
G03F 7/11 (2006.01)
G03F 7/075 (2006.01)
G03F 7/09 (2006.01)

(52) U.S. Cl.
CPC .............. *G03F 7/11* (2013.01); *G03F 7/0752* (2013.01); *G03F 7/091* (2013.01); *Y10T 428/31663* (2015.04)

(58) Field of Classification Search
CPC ..................................................... C09D 5/006
See application file for complete search history.

(56) References Cited

U.S. PATENT DOCUMENTS

| | | | |
|---|---|---|---|
| 3,813,364 A | 5/1974 | De Zuba et al. |
| 4,769,308 A | 9/1988 | Hiruma et al. |
| 5,100,503 A | 3/1992 | Allman et al. |
| 5,152,834 A | 10/1992 | Allman |
| 5,209,775 A | 5/1993 | Bank et al. |
| 5,302,198 A | 4/1994 | Allman |
| 5,472,488 A | 12/1995 | Allman |
| 5,527,872 A | 6/1996 | Allman |
| 5,665,845 A | 9/1997 | Allman |
| 5,962,188 A | 10/1999 | DeBoer et al. |
| 6,576,393 B1 | 6/2003 | Sugita et al. |
| 7,192,683 B2 | 3/2007 | Yamasaki et al. |
| 2004/0253461 A1 | 12/2004 | Ogihara et al. |
| 2004/0266925 A1 | 12/2004 | Shiono |
| 2006/0003252 A1 | 1/2006 | Hirayama et al. |
| 2006/0093959 A1 | 5/2006 | Huang et al. |
| 2007/0190459 A1 | 8/2007 | Hashimoto et al. |
| 2007/0224816 A1 | 9/2007 | Uh et al. |
| 2008/0076059 A1 | 3/2008 | Abdallah et al. |
| 2008/0107997 A1 | 5/2008 | Hiroi et al. |
| 2008/0312400 A1 | 12/2008 | Yamashita et al. |
| 2009/0050020 A1 | 2/2009 | Konno et al. |
| 2009/0130594 A1 | 5/2009 | Takei et al. |
| 2009/0148789 A1 | 6/2009 | Amara et al. |
| 2009/0162782 A1 | 6/2009 | Takei et al. |
| 2010/0151384 A1 | 6/2010 | Konno et al. |
| 2010/0304305 A1 | 12/2010 | Nakajima et al. |
| 2010/0330505 A1 | 12/2010 | Nakajima et al. |
| 2011/0143149 A1 | 6/2011 | Shibayama et al. |
| 2011/0287369 A1 | 11/2011 | Shibayama et al. |
| 2012/0178261 A1 | 7/2012 | Kanno et al. |
| 2012/0315765 A1 | 12/2012 | Nakajima et al. |
| 2013/0023602 A1 | 1/2013 | Dorman |
| 2013/0078814 A1 | 3/2013 | Shibayama et al. |

FOREIGN PATENT DOCUMENTS

| | | |
|---|---|---|
| EP | 0 260 976 A2 | 3/1988 |
| EP | 1 798 599 A1 | 6/2007 |
| EP | 1 855 159 A1 | 11/2007 |
| EP | 2 249 204 A1 | 11/2010 |

(Continued)

OTHER PUBLICATIONS

English translation of JP, 2006-182688, A (2006) from machine translation from AIPN Japan Patent Office National Center for Industrial Property Information and Training, generated Oct. 3, 2013, 34 pages.*

U.S. Office Action dated Oct. 4, 2013 from U.S. Appl. No. 13/058,109.

Translation of the Written Opinion of the International Searching Authority issued in International Patent Application No. PCT/JP2010/059117 dated Jun. 22, 2010.

International Search Report issued in International Patent Application No. PCT/JP2010/059117 dated Jun. 22, 2010.

(Continued)

*Primary Examiner* — Cynthia Hamilton
(74) *Attorney, Agent, or Firm* — Oliff PLC

(57) ABSTRACT

There is provided a resist underlayer film forming composition for lithography for forming a resist underlayer film capable of being used as a hard mask; and a forming method of a resist pattern using the underlayer film forming composition for lithography. A resist underlayer film forming composition for lithography comprising: as a silicon atom-containing compound, a hydrolyzable organosilane containing a sulfur atom-containing group, a hydrolysis product thereof, or a hydrolysis-condensation product thereof, wherein in the whole silicon atom-containing compound, the ratio of a sulfur atom to a silicon atom is less than 5% by mole. The hydrolyzable organosilane is preferably a compound of Formula (1): $[R^1{}_a Si(R^2)_{3-a}]_b R^3$ wherein $R^3$ has a partial structure of Formula (2): $R^4—S—R^5$.

15 Claims, No Drawings

(56) References Cited

FOREIGN PATENT DOCUMENTS

| | | |
|---|---|---|
| JP | A-54-123965 | 9/1979 |
| JP | A-05-027444 | 2/1993 |
| JP | A-05-311158 | 11/1993 |
| JP | A-05-333292 | 12/1993 |
| JP | A-06-001796 | 1/1994 |
| JP | A-06-228459 | 8/1994 |
| JP | A-08-053560 | 2/1996 |
| JP | A-10-209134 | 8/1998 |
| JP | A-10-510860 | 10/1998 |
| JP | A-11-012544 | 1/1999 |
| JP | A-11-258813 | 9/1999 |
| JP | A-2000-282014 | 10/2000 |
| JP | A-2001-093824 | 4/2001 |
| JP | A-2001-294810 | 10/2001 |
| JP | A-2004-276603 | 10/2004 |
| JP | A-2005-070776 | 3/2005 |
| JP | A-2005-255858 | 9/2005 |
| JP | 2006-182688 A * | 7/2006 |
| JP | A-2006-272588 | 10/2006 |
| JP | A-2007-031627 | 2/2007 |
| JP | A-2007-081133 | 3/2007 |
| JP | A-2007-241259 | 9/2007 |
| JP | A-2007-258622 | 10/2007 |
| JP | A-2008-38131 | 2/2008 |
| JP | A-2008-519297 | 6/2008 |
| JP | A-2008-213177 | 9/2008 |
| JP | A-2008-309929 | 12/2008 |
| JP | A-2009-244722 | 10/2009 |
| WO | WO 96/018918 | 6/1996 |
| WO | WO 98/28366 A1 | 7/1998 |
| WO | WO 00/001752 A1 | 1/2000 |
| WO | WO 2004/055598 A1 | 7/2004 |
| WO | WO 2005/088398 A1 | 9/2005 |
| WO | WO 2006/093057 A1 | 9/2006 |
| WO | WO 2007/066597 A1 | 6/2007 |
| WO | WO 2008/038863 A1 | 4/2008 |
| WO | WO 2009/034998 A1 | 3/2009 |
| WO | WO 2009/041511 A1 | 4/2009 |
| WO | WO 2009/104552 A1 | 8/2009 |
| WO | WO-2009/111121 A2 * | 9/2009 |
| WO | WO-2009/111122 A * | 9/2009 |

OTHER PUBLICATIONS

Mar. 10, 2009 International Search Report issued in Application No. PCT/JP2009/052535.
Nov. 2, 2009 International Search Report issued in International Application No. PCT/JP2009/064301.
Feb. 1, 2013 Office Action issued in U.S. Appl. No. 13/681,186.
Mar. 9, 2010 International Search Report issued in International Patent Application No. PCT/JP2009/070984.
Oct. 19. 2010 International Search Report issued in International Application No. PCT/JP2010/065307.
May 8, 2012 Search Report issued in European Patent Application No. 09833458.4.
Feb. 7, 2013 Office Action issued in U.S. Appl. No. 13/133,751.
U.S. Appl. No. 13/133,751, filed Aug. 4, 2011.
May 24, 2011 Translation of the Written Opinion issued in PCT/JP2011/053525.
May 24, 2011 Translation of the International Search Report issued in PCT/JP2011/053525.
Jun. 7, 2012 Office Action issued in U.S. Appl. No. 12/867,587.
Mar. 21, 2013 Final Rejection issued in U.S. Appl. No. 12/867,587.
Oct. 18, 2012 Restriction Requirement issued in U.S. Appl. No. 13/133,751.
Dec. 9, 2011 European Search Report issued in Application No. 09712238.6.
U.S. Office Action dated Oct. 21, 2013 from U.S. Appl. No. 13/681,186.
U.S. Office Action dated May 1, 2014 from U.S. Appl. No. 13/580,066.
Office Action cited in U.S. Appl. No. 13/496,768 on Jan. 3, 2014.
Office Action cited in U.S. Appl. No. 13/133,751 on Dec. 26, 2013.
Notice of Examination Opinion and Search Report dated Feb. 6, 2014 from Taiwanese Patent Application No. 098143678 (with English-language translation).
U.S. Office Action dated Dec. 3, 2013 from U.S. Appl. No. 13/580,066.
U.S. Office Action dated Sep. 11, 2014 from U.S. Appl. No. 12/867,587.
Office Action dated Oct. 31, 2014 issued in U.S. Appl. No. 13/580,066.
May 28, 2015 Office Action issued in U.S. Appl. No. 12/867,587.

* cited by examiner

RESIST UNDERLAYER FILM FORMING COMPOSITION CONTAINING SILICON HAVING SULFIDE BOND

TECHNICAL FIELD

The present invention relates to a composition for forming an underlayer film between a substrate and a resist (for example, a photoresist and an electron beam resist) that are used in the production of semiconductor devices. More specifically, the present invention relates to a resist underlayer film forming composition for lithography for forming an underlayer film used for an underlayer of a photoresist in a lithography process of the production of semiconductor devices. In addition, the present invention relates to a forming method of a resist pattern using the underlayer film forming composition.

BACKGROUND ART

Conventionally, in the production of semiconductor devices, microfabrication by lithography using a photoresist has been performed. The microfabrication is a processing method for forming fine convexo-concave shapes corresponding to the following pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted for development; and subjecting the substrate to etching processing using the resultant photoresist pattern as a protecting film. Recently, however, the high integration of semiconductor devices has progressed and the adopted active ray tends to have a shorter wavelength, such as an ArF excimer laser (193 nm) replacing a KrF excimer laser (248 nm). Following such a tendency, the influence of reflection of an active ray on a semiconductor substrate has become a large problem.

In addition, as an underlayer film between the semiconductor substrate and the photoresist, the use of a film known as a hard mask containing a metal element such as silicon and titanium (see, for example, Patent Document 1) is performed. In this case, the resist and the hard mask have components largely different from each other, so that the removal rates of the resist and the hard mask by dry etching largely depend on the type of a gas used for dry etching. Then, by appropriately selecting the type of a gas, the hard mask can be removed by dry etching without a large decrease in the film thickness of the photoresist. Thus, in the production of semiconductor devices in recent years, for achieving various effects such as the reflection preventing effect, a resist underlayer film has become disposed between the semiconductor substrate and the photoresist. Then, also until today, the studies of a composition for a resist underlayer film have been performed, however, due to the diversity of characteristics required for the composition and the like, the development of a novel material for the resist underlayer film is desired.

As an underlayer film between the semiconductor substrate and the photoresist, the use of a film known as a hard mask containing a metal element such as silicon and titanium (see, for example, Patent Document 1) is performed. In this case, the resist and the hard mask have components largely different from each other, so that the removal rates of the resist and the hard mask by dry etching largely depend on the type of a gas used for dry etching. Then, by appropriately selecting the type of a gas, the hard mask can be removed by dry etching without a large decrease in the film thickness of the photoresist. Thus, in the production of semiconductor devices in recent years, for achieving various effects such as the reflection preventing effect, a resist underlayer film has become disposed between the semiconductor substrate and the photoresist. Then, also until today, the studies of a composition for a resist underlayer film have been performed, however, due to the diversity of characteristics required for the composition and the like, the development of a novel material for the resist underlayer film is desired.

There is disclosed a composition using a compound having a silicon-silicon bond or a pattern forming method using the composition (see, for example, Patent Document 2).

On the other hand, there is also disclosed a coating agent using a polysiloxane material having a sulfide group (see, for example, Patent Document 3 and Patent Document 4).

There is disclosed an application of a polysiloxane material having a sulfide bond to a lithography process (see Patent Document 5).

RELATED-ART DOCUMENT

Patent Document

Patent Document 1: Japanese Patent Application Publication No. JP-A-11-258813
Patent Document 2: Japanese Patent Application Publication No. JP-A-10-209134
Patent Document 3: Japanese Patent Application Publication No. JP-A-2006-272588
Patent Document 4: WIPO Patent Application Publication No. WO 98/28366 A1
Patent Document 5: Japanese Patent Application Publication No. JP-A-2008-309929

DISCLOSURE OF THE INVENTION

Problem to be Solved by the Invention

It is an object of the present invention to provide a resist underlayer film forming composition for lithography capable of being used in the production of a semiconductor device.

More in detail, it is an object of the present invention to provide a resist underlayer film forming composition for lithography for forming a resist underlayer film capable of being used as a hard mask and a resist underlayer film forming composition for lithography for forming a resist underlayer film capable of being used as a bottom anti-reflective coating. Furthermore, it is an object of the present invention to provide a resist underlayer film for lithography causing no intermixing with a resist and having a dry etching rate higher than that of the resist, and a resist underlayer film forming composition for forming the underlayer film.

Then, it is an object of the present invention to provide a production method of a semiconductor device using the resist underlayer film forming composition for lithography.

Means for Solving the Problem

The present invention relates to, according to a first aspect, a resist underlayer film forming composition for lithography containing, as a silicon atom-containing compound, at least one of compound selected from a group consisting of a hydrolyzable organosilane containing a sulfur atom-containing group, a hydrolysis product thereof, and a hydrolysis-condensation product thereof, in which in the whole silicon atom-containing compound, the ratio of a sulfur atom to a silicon atom is less than 5% by mole;

according to a second aspect, the resist underlayer film forming composition according to the first aspect, in which in the whole silicon atom-containing compound, the ratio of a sulfur atom to a silicon atom is 0.5 to 4.9% by mole;

according to a third aspect, the resist underlayer film forming composition according to the first aspect or the second aspect, in which the sulfur atom-containing group contains a sulfide bond;

according to a fourth aspect, the composition according to any one of the first aspect to the third aspect, in which the hydrolyzable organosilane is a hydrolyzable organosilane of Formula (1):

$$[R^1_a Si(R^2)_{3-a}]_b R^3 \quad \text{Formula (1)}$$

(where $R^3$ is an organic group containing a sulfide bond and being bonded to a silicon atom through a Si—C bond; $R^1$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^2$ is an alkoxy group, an acyloxy group, or a halogen atom; a is an integer of 0 or 1; and b is an integer of 1 or 2);

according to a fifth aspect, the composition according to the fourth aspect, in which $R^3$ in Formula (1) has a sulfide bond moiety of Formula (2):

$$R^4\text{—S—}R^5 \quad \text{Formula (2)}$$

(where $R^4$ and $R^5$ are independently an alkyl group, an alkylene group, an aryl group, or an arylene group each of which is optionally substituted);

according to a sixth aspect, the composition according to any one of the first aspect to the fifth aspect further containing at least one of compound selected from a group consisting of a hydrolyzable organosilane of Formula (1) and a silicon atom-containing compound of Formula (3):

$$R^6_a Si(R^7)_{4-a} \quad \text{Formula (3)}$$

(where $R^6$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^7$ is an alkoxy group, an acyloxy group, or a halogen atom; and a is an integer of 0 to 3), a hydrolyzable organosilane of Formula (1) and a silicon atom-containing compound of Formula (4):

$$[R^8_c Si(R^9)_{3-c}]_2 Y_b \quad \text{Formula (4)}$$

(where $R^8$ is an alkyl group; $R^9$ is an alkoxy group, an acyloxy group, or a halogen atom; Y is an alkylene group or an arylene group; b is an integer of 0 or 1; and c is an integer of 0 or 1), and a hydrolyzable organosilane of Formula (1), a silicon atom-containing compound of Formula (3), and a silicon atom-containing compound of Formula (4), a hydrolysis product thereof, a hydrolysis-condensation product thereof, or a mixture thereof;

according to a seventh aspect, the composition according to any one of the first aspect to the sixth aspect further containing, as a polymer, a hydrolysis-condensation product of a hydrolyzable organosilane of Formula (1) or a hydrolysis-condensation product of a hydrolyzable organosilane of Formula (1) with a compound of Formula (3);

according to an eighth aspect, the composition according to any one of the first aspect to the seventh aspect, further containing, as a hydrolysis catalyst, an acid;

according to a ninth aspect, the composition according to any one of the first aspect to the eighth aspect, further containing water;

according to a tenth aspect, a resist underlayer film obtained by applying the resist underlayer film forming composition as described in any one of the first aspect to the ninth aspect on a semiconductor substrate and baking the resultant coating;

according to an eleventh aspect, a production method of a semiconductor device, containing: applying the resist underlayer film forming composition as described in any one of the first aspect to the ninth aspect on a semiconductor substrate and baking the resultant coating to form a resist underlayer film; applying a composition for a resist on the resist underlayer film to form a resist film; exposing the resist film to light; developing the resist film after the exposure to obtain a resist pattern; etching the resist underlayer film according to the resist pattern; and fabricating the semiconductor substrate according to the patterned resist film and the patterned resist underlayer film; and according to a twelfth aspect, a production method of a semiconductor device, containing: forming an organic underlayer film on a semiconductor substrate; applying, on the organic underlayer film, the resist underlayer film forming composition as described in any one of the first aspect to the ninth aspect and baking the resultant coating to form a resist underlayer film; applying, on the resist underlayer film, a composition for a resist to form a resist film; exposing the resist film to light; developing the resist film after the exposure to obtain a resist pattern; etching the resist underlayer film according to the resist pattern; etching the organic underlayer film according to the patterned resist underlayer film; and fabricating the semiconductor substrate according to the patterned organic underlayer film.

Effects of the Invention

The resist underlayer film formed using the resist underlayer film forming composition for lithography of the present invention can be used as a hard mask and a bottom anti-reflective coating, causes no intermixing with a resist, and can have a dry etching rate higher than that of a resist.

Furthermore, according to the production method of a semiconductor device of the present invention, a resist pattern after etching can have an advantageous skirt shape.

MODES FOR CARRYING OUT THE INVENTION

In the present invention, a resist underlayer film is formed on a substrate by an applying method or a resist underlayer film is formed on an organic underlayer film disposed on a substrate by an applying method, and on the resist underlayer film, a resist film (for example, a photoresist and an electron beam resist) is formed. Then, by exposure and development, a resist pattern is formed, and using the resist pattern, the resist underlayer film is dry-etched to transfer a pattern and to process the substrate according to the pattern, or an organic underlayer film is pattern-transferred by etching to process the substrate according to the organic underlayer film.

In forming a fine pattern, for preventing a pattern collapse, the resist film thickness tends to become smaller. Due to the thinning of the resist, the dry etching for transferring the pattern to a film existing as an underlayer of the resist cannot transfer the pattern unless the etching rate of the underlayer film is higher than that of the upper layer film. In the present invention, the substrate is coated with the resist underlayer film (containing an inorganic silicon-based compound) of the present specification either with or without an organic underlayer film interposed therebetween and then the resist underlayer film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern that is transferred to the resist underlayer film of the present specification existing as the underlayer of the resist pattern by dry etching the resist underlayer film with a halogen-containing gas, and the substrate is fabricated with a halogen-containing gas according to the pattern transferred to the resist underlayer film. Alternatively, by dry etching the organic underlayer film existing as the underlayer of the resist underlayer film to which the pattern is transferred with an oxygen-based gas using the resist underlayer film, the pattern is transferred to the organic underlayer film, and the substrate is fabricated with a halogen-containing gas using the organic underlayer film to which the pattern is transferred.

In the present invention, the resist underlayer film functions as a hard mask. A hydrolyzable group in the structure of Formula (1) such as an alkoxy group, an acyloxy group, and a halogen group is hydrolyzed or partially hydrolyzed, and then, the resultant silanol group forms a polymer having a polysiloxane structure by a condensation reaction thereof. This polyorganosiloxane structure has a satisfactory function as a hard mask.

The bonding moiety contained in the polyorganosiloxane has a carbon-sulfur bond or a carbon-oxygen bond that have a dry etching rate by a halogen-based gas higher than that of a carbon-carbon bond, so that the bonding moiety is effective for transferring an upper layer resist pattern to the resist underlayer film.

Then, the polyorganosiloxane structure (an intermediate film) is effective as a hard mask for etching an organic underlayer film existing under the intermediate film or for processing (etching) the substrate. In other words, the polyorganosiloxane structure has satisfactory dry etching resistance during the substrate processing or relative to an oxygen-based dry etching gas for the organic underlayer The resist underlayer film of the present invention possesses an enhanced dry etching rate relative to the upper layer resist and dry etching resistance during the substrate processing or the like.

The present invention is a resist underlayer film forming composition for lithography containing, as a silicon atom-containing compound, at least one of compound selected from a group consisting of a hydrolyzable organosilane containing a sulfur atom-containing group, a hydrolysis product thereof, and a hydrolysis-condensation product thereof, in which in the whole silicon atom-containing compound, the ratio of a sulfur atom to a silicon atom is less than 5% by mole. The sulfur atom-containing group contains a sulfide bond.

In the present invention, the silicon atom-containing compound also includes a condensation product.

These hydrolyzable organosilane, hydrolysis product thereof, and hydrolysis-condensation product thereof can also be used in combination. The hydrolyzable organosilane is hydrolyzed and the obtained hydrolysis product can be condensed to be used as a condensation product. A mixture of a hydrolysis-condensation product with partial hydrolysis product or hydrolyzable organosilane as a result of an incomplete hydrolysis when obtaining a hydrolysis-condensation product can also be used. The condensation product is a polymer having a polysiloxane structure. To this polysiloxane, an organic group containing a sulfide bond is bonded.

The resist underlayer film forming composition of the present invention contains a hydrolyzable organosilane having a sulfide bond, a hydrolysis product thereof, or a hydrolysis-condensation product thereof and a solvent. Then, the composition of the present invention may contain, as optional components, an acid, water, an alcohol, a curing catalyst, an acid generator, other organic polymers, a light-absorptive compound, a surfactant, and the like.

The solid content of the resist underlayer film forming composition of the present invention is, for example, 0.5 to 50% by mass, 1 to 30% by mass, or 1 to 25% by mass. Here, the solid content is a component remaining after subtracting a solvent component from the whole component of the resist underlayer film forming composition.

The ratio constituted by the hydrolyzable organosilane, a hydrolysis product thereof, and a hydrolysis-condensation product thereof in the solid content is 20% by mass or more, for example 50 to 100% by mass, 60 to 100% by mass, or 70 to 100% by mass.

The hydrolyzable organosilane used in the present invention has a structure of Formula (1).

$R^3$ is an organic group containing a sulfide bond and being bonded to a silicon atom through a Si—C bond. $R^1$ is an alkyl group, an aryl group, a halogenated alkyl group, a halogenated aryl group, an alkenyl group, or an organic group having an epoxy group, an acryloyl group, a methacryloyl group, a mercapto group, an amino group, or a cyano group and being bonded to a silicon atom through a Si—C bond. $R^2$ is an alkoxy group, an acyloxy group, or a halogen atom. a is an integer of 0 or 1. b is an integer of 1 or 2.

In $R^1$ of Formula (1), the alkyl group is a linear or branched $C_{1-10}$ alkyl group and examples of the alkyl group include a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

As the alkyl group, a cyclic alkyl group can also be used and examples of the cyclic alkyl group include $C_{2-10}$ cyclic alkyl groups such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthxyl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl ethenyl group, a 1,3-dimethyl-1-butenyl group, a 1,3-dimethyl-2-butenyl group, a 1,3-dimethyl-3-butenyl group, a 1-isobutyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkenyl group also include organic groups in which the above groups are substituted with a halogen atom such as a fluorine atom, a chlorine atom, a bromine atom, and an iodine atom.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having a cyano group include a cyanoethyl group and a cyanopropyl group.

Examples of a $C_{1-20}$ alkoxy group as $R^2$ in Formula (1) include $C_{1-20}$ alkoxy groups having a linear, branched, or cyclic alkyl portion such as a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group as $R^2$ include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of a $C_{1-20}$ acyloxy group as $R^2$ in Formula (1) include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of the halogen atom as $R^2$ in Formula (1) include a fluorine atom, a chlorine atom, a bromine atom, and an iodine atom.

$R^3$ in Formula (1) is an organic group containing a sulfide bond. $R^3$ in Formula (1) may have a partial structure of Formula (2). In Formula (2), $R^4$ and $R^5$ are independently an alkyl group, an alkylene group, an aryl group, or an arylene group each of which may be substituted. When b in Formula (1) is 1, any one of $R^4$ and $R^5$ is an alkyl group or an aryl group and the other is an alkylene group or an arylene group. When b in Formula (1) is 2, both of $R^4$ and $R^5$ are an alkylene group or an arylene group. Examples of the alkyl group and the aryl group include those exemplified above. The alkylene group and the arylene group can be divalent organic groups corresponding respectively to the alkyl group and the aryl group.

Examples of the hydrolyzable organosilane of Formula (1) include the compounds below.

Formula (1-1)
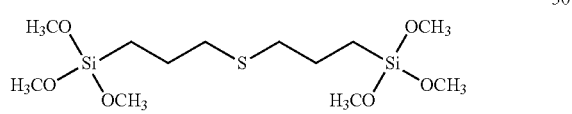

Formula (1-2)
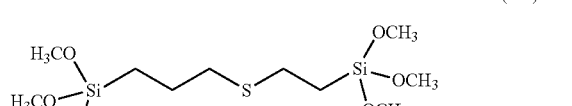

Formula (1-3)
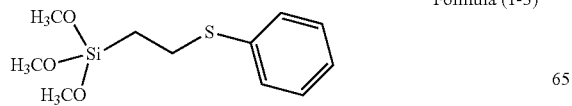

Formula (1-4)
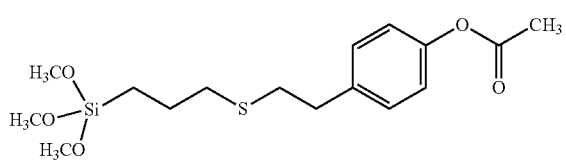

Formula (1-5)
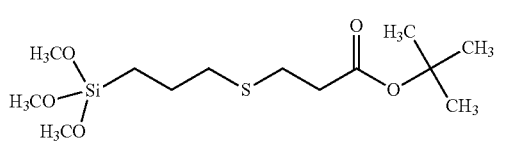

Formula (1-6)
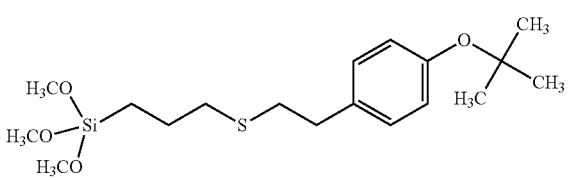

Formula (1-7)
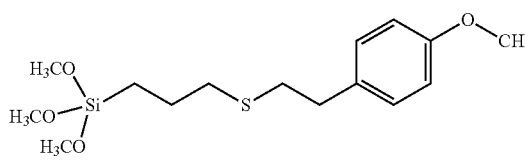

Formula (1-8)
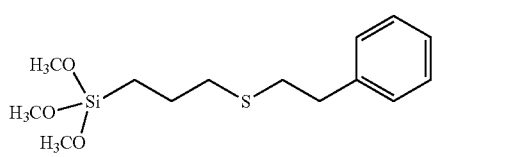

Formula (1-9)
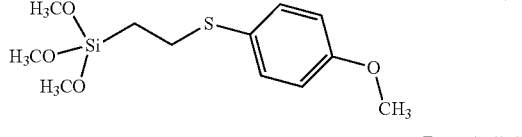

Formula (1-10)
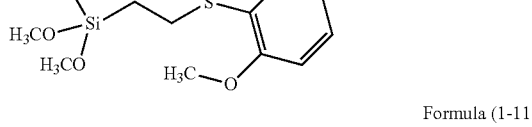

Formula (1-11)
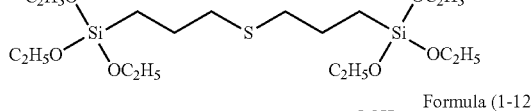

Formula (1-12)
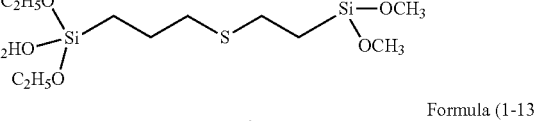

Formula (1-13)
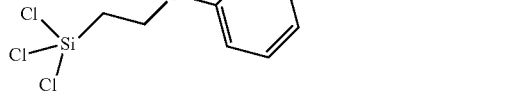

Formula (1-14)
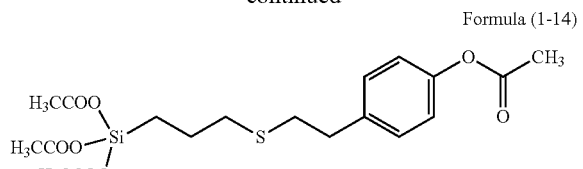

Formula (1-15)
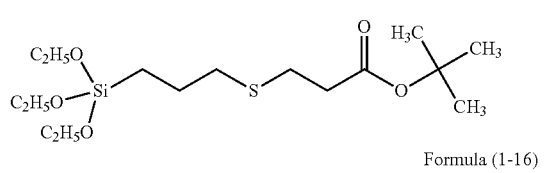

Formula (1-16)
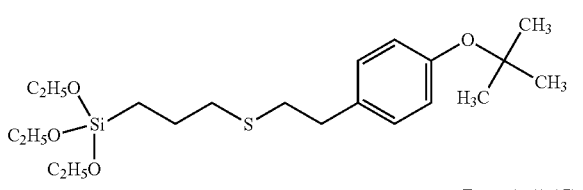

Formula (1-17)
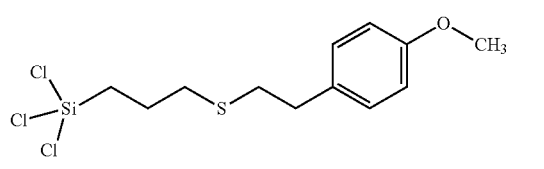

Formula (1-18)
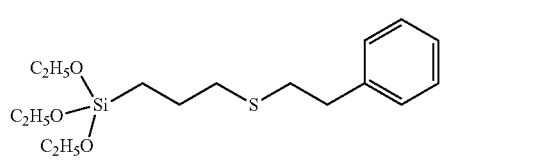

Formula (1-19)
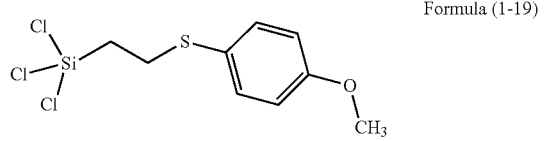

Formula (1-20)
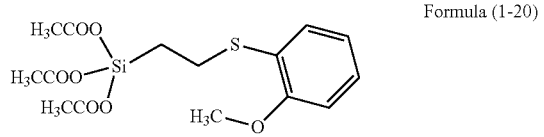

As the hydrolyzable organosilane of Formula (1), a commercially available product thereof or that synthesized can be used.

The hydrolyzable organosilane of Formula (1) can be synthesized, for example, by a reaction of a thiol group with a vinyl group. As one example thereof, the hydrolyzable organosilane can be synthesized by reacting a hydrolyzable organosilane having a thiol group or an organic group containing a thiol group with a compound having a double bond. Alternatively, the hydrolyzable organosilane can be synthesized by reacting a hydrolyzable organosilane having an organic group containing a double bond with a compound having a thiol group or an organic group containing a thiol group.

Furthermore, the hydrolyzable organosilane can be synthesized by reacting a hydrolyzable organosilane having a thiol group or an organic group containing a thiol group with a hydrolyzable organosilane having an organic group containing a double bond. When both of a thiol group or an organic group containing a thiol group and an organic group containing a double bond are a hydrolyzable silane, in Formula (1), b is an integer of 2. When any one of a thiol group or an organic group containing a thiol group and an organic group containing a double bond is a hydrolyzable silane, in Formula (1), b is an integer of 1.

In the present invention, the hydrolyzable organosilane of Formula (1) and at least one of silicon atom-containing compound selected from a group consisting of Formula (3) and Formula (4) can be used in combination.

That is, the hydrolyzable organosilane of Formula (1), a hydrolysis product thereof, or a hydrolysis-condensation product thereof and at least one of silicon atom-containing compound selected from a group of Formula (3) and Formula (4), a hydrolysis product thereof, or a hydrolysis-condensation product thereof can be used in combination.

The hydrolyzable organosilane of Formula (1) and at least one of silicon atom-containing compound selected from a group consisting of Formula (3) and Formula (4) can be used in a molar ratio in a range of 1:0 to 1:200. For obtaining an advantageous resist shape, the hydrolyzable organosilane of Formula (1) and at least one of silicon atom-containing compound selected from a group consisting of Formula (3) and Formula (4) can be used in a molar ratio in a range of 1:199 to 1:19.

As the silicon atom-containing compound selected from a group consisting of Formula (3) and Formula (4), a silicon atom-containing compound of Formula (3) is preferably used.

These are preferably used as a hydrolysis-condensation product (polyorganosiloxane), and a hydrolysis-condensation product (polyorganosiloxane) of the hydrolyzable organosilane of Formula (1) with the silicon-containing compound of Formula (3) is preferably used.

Examples of the alkyl group, the aryl group, the halogenated alkyl group, the halogenated aryl group, the alkenyl group, and the organic group having an epoxy group, an acryloyl group, a methacryloyl group, a mercapto group, or a cyano group as $R^6$, $R^7$, $R^8$, and $R^9$ and examples of the alkoxy group, the acyloxy group, and the halogen group contained in the hydrolyzable group, all of which are in the silicon atom-containing compounds of Formula (3) and Formula (4), include the examples described with respect to Formula (1).

Examples of the silicon atom-containing compound of Formula (3) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)methyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the silicon atom-containing compound of Formula (4) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the unit structure of the hydrolysis-condensation product of the hydrolyzable organosilane of Formula (1) with the silicon atom-containing compound of Formula (3) include the following.

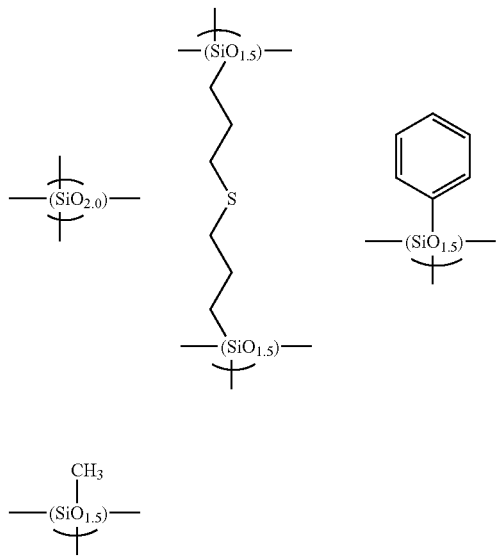

Formula (2-1)

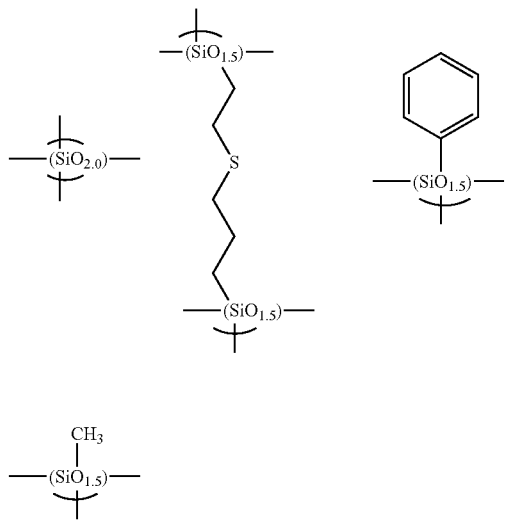

Formula (2-2)

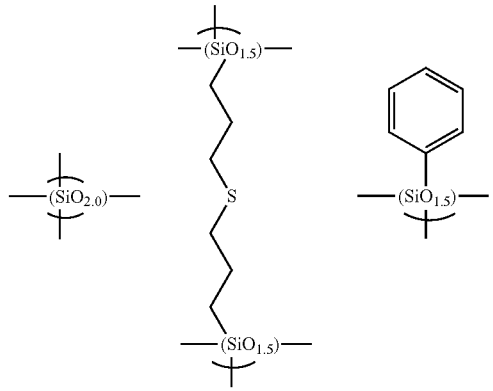

Formula (2-3)

Formula (2-4)
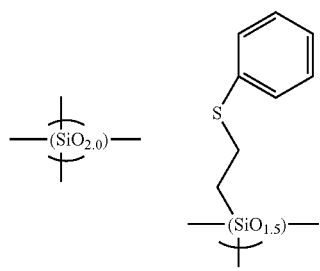
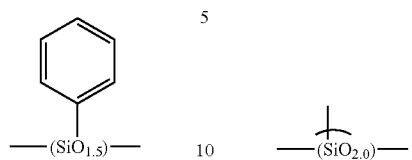
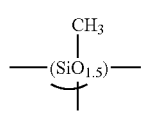
Formula (2-5)
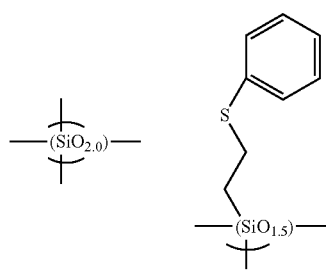
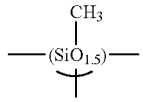
Formula (2-6)
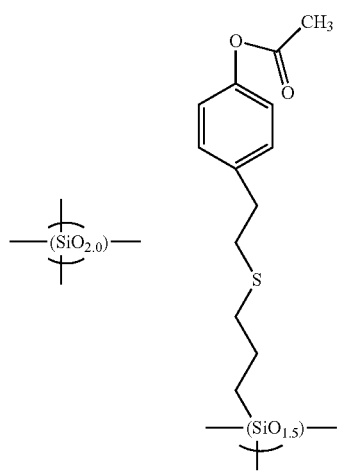
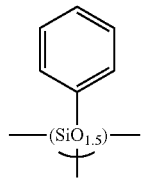
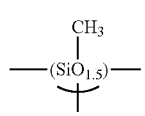
Formula (2-7)
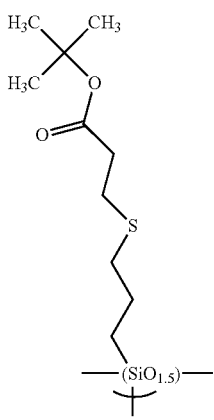
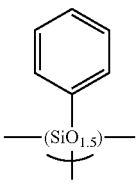
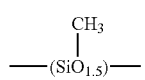
Formula (2-8)
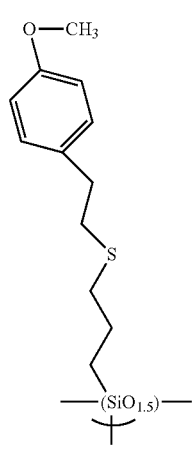
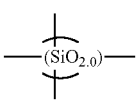
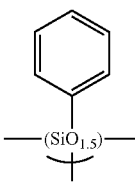
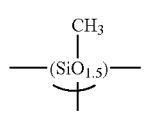

Formula (2-9)

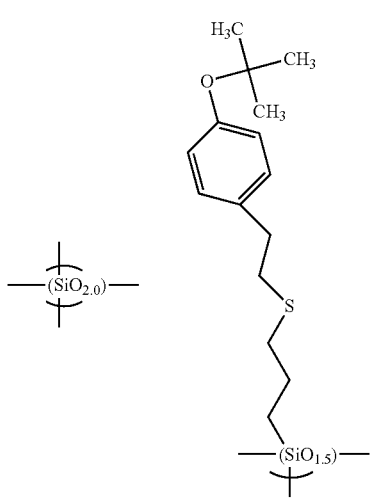

Formula (2-10)

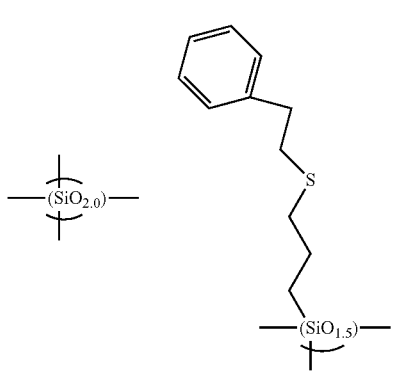

Formula (2-11)

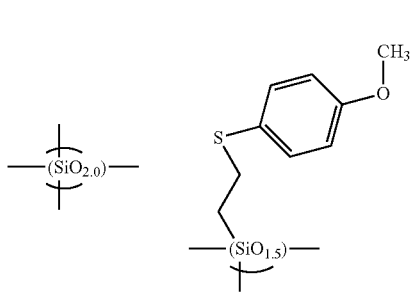

Formula (2-12)

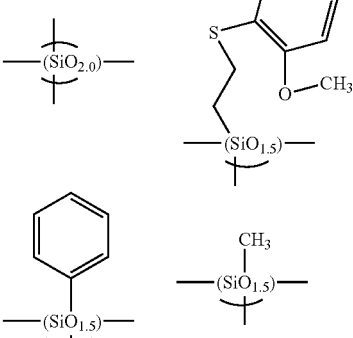

The hydrolysis-condensation product (polyorganosiloxane) of the hydrolyzable organosilane of Formula (1) or the hydrolysis-condensation product (polyorganosiloxane) of the hydrolyzable organosilane of Formula (1) with at least one of silicon atom-containing compound selected from a group consisting of Formula (3) and Formula (4) can be obtained as a condensation product having a weight average molecular weight of 1,000 to 1,000,000 or 1,000 to 100,000. This molecular weight is a molecular weight in terms of polystyrene, measured by a GPC analysis.

Examples of the condition for the GPC measurement include: using a GPC apparatus (trade name: HLC-8220GPC; manufactured by Tosoh Corporation); using a GPC column (trade names: Shodex KF803L, KF802, and KF801; manufactured by Showa Denko); at a column temperature of 40° C.; using tetrahydrofuran as the eluting liquid (eluting solvent); at a flow amount (flow rate) of 1.0 mL/min; and using polystyrene (manufactured by Showa Denko K.K.) as the standard sample.

For the hydrolysis of an alkoxysilyl group, an acyloxysilyl group, or a halogenated silyl group, water is used in an amount of 0.5 to 100 moles, preferably 1 to 10 mole(s), relative to 1 mole of a hydrolyzable group.

A catalyst for the hydrolysis can be used in an amount of 0.001 to 10 moles, preferably 0.001 to 1 mole(s), relative to 1 mole of a hydrolyzable group.

The reaction temperature for performing the hydrolysis and the condensation is usually 20 to 80° C.

The hydrolysis may be performed either perfectly or partially. That is, in the hydrolysis-condensation product, a hydrolysis product or a monomer may remain.

During the hydrolysis and the condensation, a catalyst can be used.

Examples of the catalyst for the hydrolysis include a metal chelate compound, an organic acid, an inorganic acid, an organic base, and an inorganic base.

Examples of the metal chelate compound as the catalyst for the hydrolysis include: titanium chelate compounds such as triethoxy/mono(acetylacetonate)titanium, tri-n-propoxy/mono(acetylacetonate)titanium, tri-isopropoxy/mono(acetylacetonate)titanium, tri-n-butoxy/mono(acetylacetonate)titanium, tri-sec-butoxy/mono(acetylacetonate)titanium, tri-tert-butoxy/mono(acetylacetonate)titanium, diethoxy/bis(acetylacetonate)titanium, di-n-propoxy/bis(acetylacetonate)titanium, di-isopropoxy/bis(acetylacetonate)titanium, di-n-butoxy/bis(acetylacetonate)titanium, di-sec-butoxy/bis(acetylacetonate)titanium, di-tert-butoxy/bis(acetylacetonate)titanium, monoethoxy/tris (acetylacetonate)titanium, mono-n-propoxy/tris(acetylacetonate)titanium, mono-isopropoxy/tris(acetylacetonate) titanium, mono-n-butoxy/tris(acetylacetonate)titanium, mono-sec-butoxy/tris(acetylacetonate)titanium, mono-tert-butoxy/tris(acetylacetonate)titanium, tetrakis(acetylacetonate)titanium, triethoxy/mono(ethylacetoacetate)titanium, tri-n-propoxy/mono(ethylacetoacetate)titanium, tri-isopropoxy/mono(ethylacetoacetate)titanium, tri-n-butoxy/mono(ethylacetoacetate)titanium, tri-sec-butoxy/mono(ethylacetoacetate)titanium, tri-tert-butoxy/mono(ethylacetoacetate)titanium, diethoxy/bis(ethylacetoacetate)titanium, di-n-propoxy/bis(ethylacetoacetate)titanium, di-isopropoxy/bis(ethylacetoacetate)titanium, di-n-butoxy/bis(ethylacetoacetate)titanium, di-sec-butoxy/bis(ethylacetoacetate)titanium, di-tert-butoxy/bis(ethylacetoacetate)titanium, monoethoxy/tris(ethylacetoacetate)titanium, mono-n-propoxy/tris(ethylacetoacetate)titanium, mono-isopropoxy/tris(ethylacetoacetate)titanium, mono-n-butoxy/tris(ethylacetoacetate)titanium, mono-sec-butoxy/tris(ethylacetoacetate)titanium, mono-tert-butoxy/tris(ethylacetoacetate)titanium, tetrakis(ethylacetoacetate) titanium, mono(acetylacetonate)tris(ethylacetoacetate) titanium, bis(acetylacetonate)bis(ethylacetoacetate) titanium, and tris(acetylacetonate)mono(ethylacetoacetate) titanium; zirconium chelate compounds such as triethoxy/mono(acetylacetonate)zirconium, tri-n-propoxy/mono(acetylacetonate)zirconium, tri-isopropoxy/mono(acetylacetonate)zirconium, tri-n-butoxy/mono(acetylacetonate)zirconium, tri-sec-butoxy/mono(acetylacetonate)zirconium, tri-tert-butoxy/mono(acetylacetonate)zirconium, diethoxy/bis(acetylacetonate)zirconium, di-n-propoxy/bis(acetylacetonate)zirconium, di-isopropoxy/bis(acetylacetonate)zirconium, di-n-butoxy/bis(acetylacetonate)zirconium, di-see-butoxy/bis(acetylacetonate)zirconium, di-tert-butoxy/bis(acetylacetonate)zirconium, monoethoxy/tris(acetylacetonate)zirconium, mono-n-propoxy/tris(acetylacetonate) zirconium, mono-isopropoxy/tris(acetylacetonate) zirconium, mono-n-butoxy/tris(acetylacetonate)zirconium, mono-sec-butoxy/tris(acetylacetonate)zirconium, mono-tert-butoxy/tris(acetylacetonate)zirconium, tetrakis(acetylacetonate)zirconium, triethoxy/mono(ethylacetoacetate)zirconium, tri-n-propoxy/mono(ethylacetoacetate)zirconium, tri-isopropoxy/mono(ethylacetoacetate)zirconium, tri-n-butoxy/mono(ethylacetoacetate)zirconium, tri-see-butoxy/mono(ethylacetoacetate)zirconium, tri-tert-butoxy/mono(ethylacetoacetate)zirconium, diethoxy/bis(ethylacetoacetate)zirconium, di-n-propoxy/bis(ethylacetoacetate)zirconium, di-isopropoxy/bis(ethylacetoacetate)zirconium, di-n-butoxy/bis(ethylacetoacetate)zirconium, di-sec-butoxy/bis(ethylacetoacetate)zirconium, di-tert-butoxy/bis(ethylacetoacetate)zirconium, monoethoxy/tris(ethylacetoacetate)zirconium, mono-n-propoxy/tris(ethylacetoacetate)zirconium, mono-isopropoxy/tris(ethylacetoacetate)zirconium, mono-n-butoxy/tris(ethylacetoacetate)zirconium, mono-sec-butoxy/tris(ethylacetoacetate)zirconium, mono-tert-butoxy/tris(ethylacetoacetate)zirconium, tetrakis(ethylacetoacetate) zirconium, mono(acetylacetonate)tris(ethylacetoacetate) zirconium, bis(acetylacetonate)bis(ethylacetoacetate) zirconium, and tris(acetylacetonate)mono(ethylacetoacetate) zirconium; and aluminum chelate compounds such as tris(acetylacetonate)aluminum and tris(ethylacetoacetate) aluminum.

Examples of the organic acid as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the catalyst for the hydrolysis include hydrochloric acid, nitric acid, sulfuric acid, hydrofluoric acid, and phosphoric acid.

Examples of the organic base as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammonium hydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and these catalysts may be used individually or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycal, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more types thereof.

Particularly, ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone are preferred in terms of the preservation stability of the solution thereof.

The resist underlayer film forming composition of the present invention may contain a curing catalyst. The curing catalyst performs its function as a curing catalyst when the coating film containing a polyorganosiloxane composed of a hydrolysis-condensation product is heated to be cured.

As the curing catalyst, there can be used an ammonium salt, phosphines, a phosphonium salt, and a sulfonium salt.

Examples of the ammonium salt include: quaternary ammonium salts having a structure of Formula (D-1):

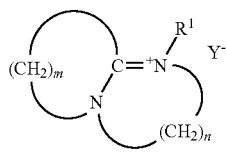

Formula (D-1)

(where m is 2 to 11; n is an integer of 2 to 3; $R^1$ is an alkyl group or an aryl group; and r is an anion);

quaternary ammonium salts having a structure of Formula (D-2):

$$R^2R^3R^4R^5N^+Y^-$$ Formula (D-2)

(where $R^2$, $R^3$, $R^4$, and $R^5$ are an alkyl group or an aryl group; N is a nitrogen atom; and $Y^-$ is an anion, where $R^2$, $R^3$, $R^4$, and $R^5$ are individually bonded to a nitrogen atom through a C—N bond);

quaternary ammonium salts having a structure of Formula (D-3):

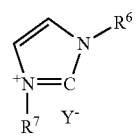

Formula (D-3)

(where $R^6$ and $R^7$ are an alkyl group or an aryl group; and $Y^-$ is an anion); quaternary ammonium salts having a structure of Formula (D-4):

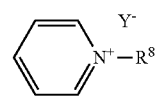

Formula (D-4)

(where $R^8$ is an alkyl group or an aryl group; and $Y^-$ is an anion); quaternary ammonium salts having a structure of Formula (D-5):

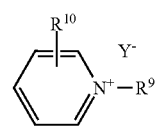

Formula (D-5)

(where $R^9$ and $R^{10}$ are an alkyl group or an aryl group; and $Y^-$ is an anion); and tertiary ammonium salts having a structure of Formula (D-6):

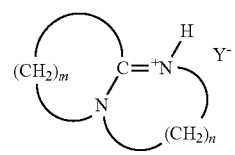

Formula (D-6)

(where m is 2 to 11; n is an integer of 2 to 3; H is a hydrogen atom; and $Y^-$ is an anion).

Examples of the phosphonium salt include quaternary phosphonium salts of Formula (D-7):

$$R^{11}R^{12}R^{13}R^{14}P^+Y^-$$ Formula (D-7)

(where $R^{11}$, $R^{12}$, $R^{13}$, and $R^{14}$ are an alkyl group or an aryl group; P is a bonded to a phosphorus atom through a C—P bond).

Examples of the sulfonium salt include tertiary sulfonium salts of Formula (D-8):

$$R^{15}R^{16}R^{17}S^+Y^-$$ Formula (D-8)

(where $R^{15}$, $R^{16}$, and $R^{17}$ are an alkyl group or an aryl group; S is a sulfur atom; and $Y^-$ is an anion, where $R^{15}$, $R^{16}$, and $R^{17}$ are individually bonded to a sulfur atom through a C—S bond).

The compound of Formula (D-1) is a quaternary ammonium salt derived from an amine, and m is 2 to 11, and n is an integer of 2 to 3. R' of the quaternary ammonium salt is a $C_{1-18}$, preferably $C_{2-10}$, alkyl group or aryl group and examples thereof include: linear alkyl groups such as an ethyl group, a propyl group, and a butyl group; a benzyl group; a cyclohexyl group; a cyclohexylmethyl group; and a dicyclopentadienyl group. Examples of the anion ($Y^-$) include halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$).

The compound of Formula (D-2) is a quaternary ammonium salt of $R^2R^3R^4R^5N^+Y^-$. $R^2$, $R^3$, $R^4$, and $R^5$ of the quaternary ammonium salt are a $C_{1-18}$ alkyl group or aryl group, or a group bonded to a silicon atom through a Si—C bond. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The quaternary ammonium salt is commercially available and examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of Formula (D-3) is a quaternary ammonium salt derived from a 1-substituted imidazole, and $R^6$ and $R^7$ are a $C_{1-18}$ organic group and the sum of the numbers of carbon atoms of $R^6$ and $R^7$ is preferably 7 or more. Examples of $R^6$ include a methyl group, an ethyl group, a propyl group, a phenyl group, and a benzyl group and examples of $R^7$ include a benzyl group, an octyl group, and an octadecyl group. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The compound either is commercially available or can be produced by, for example, reacting an imidazole-based compound such as 1-methylimidazole and 1-benzylimidazole with halogenated alkyl or halogenated aryl such as benzyl bromide and methyl bromide.

The compound of Formula (D-4) is a quaternary ammonium salt derived from pyridine, and $R^8$ is a $C_{1-18}$, preferably $C_{4-18}$, alkyl group or aryl group and examples thereof include a butyl group, an octyl group, a benzyl group, and a lauryl group. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The compound either is commercially available or can be produced by, for example, reacting pyridine with halogenated alkyl or halogenated aryl such as lauryl chloride, benzyl chloride, benzyl bromide, methyl bromide, and octyl bromide. Examples of the compound include N-laurylpyridinium chloride and N-benzylpyridinium bromide.

The compound of Formula (D-5) is a quaternary ammonium salt derived from a substituted pyridine represented by picoline and the like, and $R^9$ is a $C_{1-18}$, preferably $C_{4-18}$, alkyl group or aryl group and examples thereof include a methyl group, an octyl group, a lauryl group, and a benzyl group. $R^{10}$ is a $C_{1-18}$ alkyl group or aryl group, and when the compound is, for example, a quaternary ammonium derived from picoline, $R^{10}$ is a methyl group. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The compound either is commercially available or can be produced by, for example, reacting a substituted pyridine such as picoline with halogenated alkyl or halogenated aryl such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of Formula (D-6) is a tertiary ammonium salt derived from an amine, and m is 2 to 11 and n is an integer of 2 to 3. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The compound can be produced by a reaction of an amine with a weak acid such as a carboxylic acid and phenol. Examples of the carboxylic acid include formic acid and acetic acid. When formic acid is used, the anion ($Y^-$) is ($HCOO^-$), and when acetic acid is used, the anion ($Y^-$) is ($CH_3COO^-$). When phenol is used, the anion ($Y^-$) is ($C_6H_5O^-$).

The compound of Formula (D-7) is a quaternary phosphonium salt having a structure of $R^{11}R^{12}R^{13}P^+Y^-$. $R^{11}$, $R^{12}$, $R^{13}$, and $R^{14}$ are a $C_{1-18}$ alkyl group or aryl group, or a group bonded to a silicon atom through a Si—C bond. However, preferably, three groups among the four substituents of $R^{11}$ to $R^{14}$ are a phenyl group or a substituted phenyl group such as a phenyl group and a tolyl group, and the last group is a $C_{1-18}$ alkyl group or aryl group, or a group bonded to a silicon atom through a Si—C bond. Examples of the anion ($Y^-$) include: halogen ions such as a chlorine ion ($Cl^-$), a bromine ion ($Br^-$), and an iodine ion ($I^-$); and acid groups such as carboxylate (—$COO^-$), sulfonate (—$SO_3^-$), and alcoholate (—$O^-$). The compound is commercially available and examples of the compound include: halogenated tetraalkylphosphoniums such as a halogenated tetra n-butylphosphonium and a halogenated tetra n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylbenzylphosphoniums; halogenated tetraphenylphosphoniums; halogenated tritolylmonoarylphosphoniums; and halogenated tritolylmonoalkylphosphoniums (where the halogen atom is a chlorine atom or a bromine atom). Particularly preferred examples of the compound include: halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (where the halogen atom is a chlorine atom or a bromine atom).

Examples of the phosphines include: primary phosphines such as methylphosphine, ethylphosphine, propylphosphine, isopropylphosphine, isobutylphosphine, and phenylphosphine; secondary phosphines such as dimethylphosphine, diethylphosphine, diisopropylphosphine, diisoamylphosphine, and diphenylphosphine; and tertiary phosphines such as trimethylphosphine, triethylphosphine, triphenylphosphine, methyldiphenylphosphine, and dimethylphenylphosphine.

The compound of Formula (D-8) is a tertiary sulfonium salt having a structure of $R^{15}R^{16}R^{17}S^+Y^-$. $R^{15}$, $R^{16}$, and $R^{17}$ are a $C_{1-18}$ alkyl group or aryl group, or a group bonded to a silicon atom through a Si—C bond. However, preferably, three groups among the four substituents of $R^{15}$ to $R^{17}$ are a phenyl group or a substituted phenyl group such as a phenyl group and a tolyl group, and the last group is a $C_{1-48}$ alkyl group or aryl group.

Examples of the anion ($Y^-$) include: halogen ions such as a chlorine ion ($Cl^-$), a bromine ion ($Br^-$), and an iodine ion ($I^-$); and acid groups such as carboxylate (—COO$^-$), sulfonate (—SO$_3^-$), and alcoholate (—O$^-$). The compound is commercially available and examples of the compound include: halogenated tetraalkylsulfoniums such as a halogenated tri n-butylsulfonium and a halogenated tri n-propylsulfonium; halogenated trialkylbenzylsulfoniums such as a halogenated diethylbenzylsulfonium; halogenated diphenylmonoalkylsulfoniums such as a halogenated diphenylmethylsulfonium and a halogenated diphenylethylsulfonium; halogenated triphenylsulfoniums, (where the halogen atom is a chlorine atom or a bromine atom); tetraalkylphosphonium carboxylates such as tri n-butylsulfonium carboxylate and tri n-propylsulfonium carboxylate; trialkylbenzylsulfonium carboxylates such as diethylbenzylsulfonium carboxylate; diphenylmonoalkylsulfonium carboxylates such as diphenylmethylsulfonium carboxylate and diphenylethylsulfonium carboxylate; and triphenylsulfonium carboxylate. Particularly preferred examples of the compound include a halogenated triphenylsulfonium and triphenylsulfonium carboxylate.

The amount of the curing catalyst is 0.01 to 10 parts by mass, or 0.01 to 5 parts by mass, or 0.01 to 3 parts by mass, relative to 100 parts by mass of the polyorganosiloxane.

From the hydrolysis-condensation product (polymer) obtained by hydrolyzing and condensing a hydrolyzable organosilane in a solvent using a catalyst, an alcohol as a by-product and the used hydrolysis catalyst and water can simultaneously be removed by distilling them under reduced pressure or the like. The acid or the base catalyst used for the hydrolysis can be removed by neutralization or ion-exchange. Then, in the resist underlayer film forming composition for lithography of the present invention containing the hydrolysis-condensation product thereof, an organic acid, water, an alcohol, or a combination thereof can be blended for the stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be blended in is 0.5 to 5.0 parts by mass, relative to 100 parts by mass of the condensation product (polyorganosiloxane). As the water to be blended in, pure water, ultrapure water, ion-exchanged water, or the like can be used and the blended amount thereof can be 1 to 20 parts) by mass, relative to 100 parts by mass of the resist underlayer film forming composition.

As the alcohol to be blended in, an alcohol that is easily vaporized by heating after the application is preferred and examples thereof include methanol, ethanol, propanol, isopropanol, and butanol. The amount of the alcohol to be blended in can be 1 to 20 part(s) by mass, relative to 100 parts by mass of the resist underlayer film forming composition.

The underlayer film forming composition for lithography of the present invention may contain, if necessary, an organic polymer compound, a photoacid generator, a surfactant, and the like, besides the above components.

By using an organic polymer compound, there can be controlled the dry etching rate (a decreased amount of the film thickness per unit time), the attenuation coefficient, the refractive index, and the like of a resist underlayer film formed from the underlayer film forming composition for lithography of the present invention.

The organic polymer compound is not particularly limited and various organic polymers such as condensation-polymerized polymers and addition-polymerized polymers can be used. As the organic polymer compound, there can be used addition-polymerized polymers and condensation-polymerized polymers such as polyesters, polystyrenes, polyimides, acrylic polymers, methacrylic polymers, polyvinylethers, phenolnovolacs, naphtholnovolacs, polyethers, polyamides, and polycarbonates. There are preferably used an organic polymer having an aromatic ring structure functioning as a light absorbing moiety such as a benzene ring, a naphthalene ring, an anthracene ring, a triazine ring, a quinoline ring, and a quinoxaline ring.

Examples of such an organic polymer compound include addition-polymerized polymers containing, as a structure unit thereof, an addition-polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether, and N-phenylmaleimide, and condensation-polymerized polymers such as phenolnovolacs and naphtholnovolacs.

When an addition-polymerized polymer is used as the organic polymer compound, the polymer compound may be either a homopolymer or a copolymer. For producing the addition-polymerized polymer, an addition-polymerizable monomer is used. Examples of such an addition-polymerizable monomer include acrylic acid, methacrylic acid, an acrylic acid ester compound, a methacrylic acid ester compound, an acrylamide compound, a methacrylamide compound, a vinyl compound, a styrene compound, a maleimide compound, maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation-polymerized polymer is used as the polymer, examples of such a polymer include condensation-polymerized polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer include polyesters, polyamides, and polyimides such as polypyromellitimide, poly(p-phenyleneterephthalamide), polybutyleneterephthalate, and polyethyleneterephthalate.

When the organic polymer compound contains a hydroxy group, the hydroxy group can effect a crosslinking reaction with a polyorganosiloxane.

As the organic polymer compound, there can be used a polymer compound having a weight average molecular weight of, for example, 1,000 to 1,000,000, or 3,000 to 300,000, or 5,000 to 200,000, or 10,000 to 100,000.

The organic polymer compounds may be used individually or in combination of two or more types thereof.

When the organic polymer compound is used, the ratio thereof is 1 to 200 part(s) by mass, or 5 to 100 parts by mass, or 10 to 50 parts by mass, or 20 to 30 parts by mass, relative to 100 parts by mass of the condensation product (polyorganosiloxane).

The resist underlayer film forming composition of the present invention may contain an acid generator.

Examples of the acid generator include a thermoacid generator and a photoacid generator.

The photoacid generator generates an acid during exposure of the resist. Therefore, the acidity of the underlayer film can be controlled. This is one method for adjusting the acidity of the underlayer film to that of the resist as an upper layer of the underlayer film. By adjusting the acidity of the underlayer film, the pattern shape of the resist formed in the upper layer can be controlled.

Examples of the photoacid generator contained in the resist underlayer film forming composition of the present invention include an onium salt compound, a sulfonimide compound, and a disulfonyl diazomethane compound.

Examples of the onium salt compound include: iodonium salt compounds such as diphenyliodoniumhexafluorophosphate, diphenyliodoniumtrifluoromethanesulfonate, diphenyliodoniumnonafluoro normal butane sulfonate, diphenyliodoniumperfluoro normal octane sulfonate, diphenyliodoniumamphorsulfonate, bis(4-tert-butylphenyl)iodoniumcamphorsulfonate, and bis(4-tert-butylphenyl)iodoniumtrifluoromethanesulfonate; and sulfonium salt compounds such as triphenylsulfoniumhexafluoroantimonate, triphenylsulfoniumnonafluoro normal butane sulfonate, triphenylsulfoniumamphorsulfonate, and triphenylsulfoniumtrifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy) naphthalimide.

Examples of the disulfonyl diazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyl diazomethane.

These photoacid generators may be used individually or in combination of two or more types thereof.

When the photoacid generator is used, the ratio thereof is 0.01 to 5 parts by mass, or 0.1 to 3 parts by mass, or 0.5 to 1 part(s) by mass, relative to 100 parts by mass of the condensation product (polyorganosiloxane).

The surfactant is effective for suppressing the formation of a pinhole, a striation, and the like when the resist underlayer film forming composition for lithography of the present invention is applied on a substrate.

Examples of the surfactant contained in the resist underlayer film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene/polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (manufactured by Sumitomo 3M Limited), Asahi-Guard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). These surfactants may be used individually or in combination of two or more types thereof. When the surfactant is used, the ratio thereof is 0.0001 to 5 parts by mass, or 0.001 to 1 part(s) by mass, or 0.01 to 0.5 parts by mass, relative to 100 parts by mass of the condensation product (polyorganosiloxane).

In the resist underlayer film forming composition of the present invention, a rheology controlling agent and an adhesion assistant can be blended. The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited so long as the solvent can dissolve the above solid content. Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, propylene glycol monoethyl ether, methylisobutylcarbinol, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents may be used individually or in combination of two or more types thereof.

Hereinafter, the use of the resist underlayer film forming composition of the present invention is described.

The resist underlayer film forming composition of the present invention is applied on a substrate used in the production of semiconductor devices (for example, silicon wafer substrates, silicon/silicon dioxide coated substrates, silicon nitride substrates, glass substrates, ITO substrates, polyimide substrates, and low dielectric constant material (low-k material) coated substrates) by an appropriate coating method such as a spinner and a coater and, then, is baked to form a resist underlayer film. The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes. Here, the formed underlayer film has a film thickness of, for example, 10 to 1,000 nm, or 20 to 500 nm, or 50 to 300 nm, or 100 to 200 nm.

Next, on the resist underlayer film, for example a photoresist layer is formed. The formation of the photoresist layer can be performed by a known method, that is, by applying a photoresist composition solution on the underlayer film and by baking the composition solution. The photoresist has a film thickness of, for example, 50 to 10,000 nm, or 100 to 2,000 nm, or 200 to 1,000 nm.

In the present invention, after forming the organic underlayer film on the substrate, the resist underlayer film of the present invention can be formed on the organic underlayer film, and further, the resist underlayer film can be coated with the photoresist. Thus, even when the pattern width of the photoresist becomes smaller and the photoresist is coated thinly for preventing a pattern collapse, the processing of the substrate becomes possible by selecting an appropriate etching gas. For example, the resist underlayer film of the present invention can be processed by using a fluorine-based gas having an etching rate of the resist underlayer film satisfactorily higher than that of the photoresist as an etching gas, and the organic underlayer film can be processed by using an oxygen-based gas having an etching rate of the organic underlayer film satisfactorily higher than that of the resist underlayer film of the present invention as an etching gas. Furthermore, the substrate can be processed by using a fluorine-based gas having an etching rate of the substrate satisfactorily higher than that of the organic underlayer film as an etching gas.

The photoresist formed on the resist underlayer film of the present invention is not particularly limited so long as the photoresist is sensitive to light used for the exposure, and both of a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, a KrF excimer laser (wavelength: 248 nm), an ArF excimer laser (wavelength: 193 nm), a $F_2$ excimer laser (wavelength: 157 nm), and the like can be used. After the exposure, if necessary, post exposure bake can also be performed. The post exposure bake is performed under conditions accordingly selected from baking temperatures of 70° C. to 150° C. and baking times of 0.3 to 10 minutes.

In the present invention, as the resist, a resist for electron beam lithography can be used instead of the photoresist. As the electron beam resist, both a positive type and a negative type can be used. Examples of the electron beam resist include: a chemical amplification-type resist made of a binder having a group changing the alkali dissolving rate by being decomposed by an acid generator and an acid; a chemical amplification-type resist made of an alkali-soluble binder and a low molecule compound changing the alkali dissolving rate of a resist by being decomposed by an acid generator and an acid; a chemical amplification-type resist made of a binder having a group changing the alkali dissolving rate by being decomposed by an acid generator and an acid, and a low molecule compound changing the alkali dissolving rate of a resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Furthermore, in these developers, a surfactant and the like may also be blended. The conditions for the development are accordingly selected from temperatures of 5 to 50° C. and times of 10 to 600 seconds.

Then, using the thus formed pattern of the photoresist (upper layer) as a protecting film, the removal of the resist underlayer film (intermediate layer) of the present invention is performed, and next, using the film composed of the patterned photoresist and the patterned resist underlayer film (intermediate layer) of the present invention as a protecting film, the removal of the organic underlayer film (underlayer) is performed. Finally, using the patterned resist underlayer film (intermediate layer) of the present invention and the patterned organic underlayer film (underlayer) as a protecting film, the processing of the semiconductor substrate is performed.

First, the resist underlayer film (intermediate layer) of the present invention at the part where the photoresist is removed is removed by dry etching to expose the semiconductor substrate. For dry etching the resist underlayer film of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane. For dry etching the resist underlayer film, a halogen-based gas is preferably used. By dry etching with a halogen-based gas, fundamentally, a photoresist composed of organic substances is difficult to be removed. On the contrary, the resist underlayer film of the present invention containing a large amount of silicon atoms is immediately removed by a halogen-based gas. Therefore, the decrease of the film thickness of the photoresist according to dry etching of the resist underlayer film can be suppressed. Then, as a result, the photoresist can be used as a thin film. The resist underlayer film is dry-etched preferably with a fluorine-based gas and examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the film composed of the patterned photoresist and the patterned resist underlayer film of the present invention as a protecting film, the removal of the organic underlayer film is performed. The removal of the organic underlayer film (underlayer) is performed by dry etching preferably with an oxygen-based gas. This is because the resist underlayer film of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

As an upper layer of the resist underlayer film of the present invention, an organic bottom anti-reflective coating can be formed before the formation of the photoresist. The bottom anti-reflective coating composition used here is not particularly limited and can optionally be selected from the compositions commonly used in a conventional lithography process to be used. In addition, the formation of the bottom anti-reflective coating can be performed by a commonly used method, for example, by applying a bottom anti-reflective coating composition by a spinner or a coater and by baking the composition.

The substrate on which the resist underlayer film forming composition of the present invention is applied to may also be a substrate having an organic or inorganic bottom anti-reflective coating formed by a CVD method and the like on its surface, and on the bottom anti-reflective coating, the underlayer film of the present invention can also be formed.

A resist underlayer film formed from the resist underlayer film forming composition of the present invention may absorb light used in a lithography process depending on the wavelength of the light. Then, in such a case, the resist underlayer film can function as a bottom anti-reflective coating having the effect of preventing a reflection light on the substrate. Furthermore, the underlayer film of the present invention can also be used as a layer for preventing an interaction between the substrate and the photoresist, a layer having a function of preventing an adverse action of a material used in the photoresist or of a substance generated during exposure of the photoresist against the substrate, a layer having a function of preventing the diffusion of a substance generated in or on the substrate during heating and baking to the upper layer photoresist, a barrier layer for reducing a poisoning effect to the photoresist layer by a semiconductor substrate dielectric layer, and the like.

A resist underlayer film formed from the resist underlayer film forming composition can be applied to a substrate in which a via hole used in the dual damascene process is formed to be used as an embedding material capable of filling the hole without a void. The resist underlayer film can also be used as a planarizing material for planarizing the surface of a semiconductor substrate having unevenness.

Hereinafter, the present invention will be more specifically described referring to Examples that should not be construed as limiting the scope of the present invention.

EXAMPLES

First, the synthesis of a hydrolyzable silane of Formula (1) to be used as a raw material was performed. The obtained compound was subjected to the determination by $^1$H-NMR measurement. The determination was performed using a test tube: 5 mm, a solvent: deuterated chloroform, a measuring temperature: room temperature, a pulse interval: 5 seconds, an accumulation number: 32, and a standard sample: tetramethylsilane (TMS).

(Synthesis of Raw Material 1)

Into a 100 mL flask, 12.1 g of 3-mercaptopropyltrimethoxysilane, 10.0 g of allyltrimethoxysilane, 0.26 g of azobisisobutyronitrile, and 25 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-1) that was an objective product.

$^1$H-NMR (400 MHz): 0.76 ppm (t, 4H), 1.69 ppm (quint, 4H), 2.52 ppm (t, 2H), 3.57 ppm (s, 18H).

(Synthesis of Raw Material 2)

Into a 100 mL flask, 13.45 g of vinyltrimethoxysilane, 10.00 g of benzenethiol, 0.37 g of azobisisobutyronitrile, and 25 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-3) that was an objective product.

$^1$H-NMR (400 MHz): 1.05 ppm (t, 2H), 3.02 ppm (t, 2H), 3.57 ppm (s, 9H), 7.15-7.34 ppm (m, 5H).

(Synthesis of Raw Material 3)

Into a 100 mL flask, 6.05 g of 3-mercaptopropyltrimethoxysilane, 5.00 g of 4-vinylphenyl acetate, 0.13 g of azobisisobutyronitrile, and 15 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-4) that was an objective product.

$^1$H-NMR (400 MHz): 0.76 ppm (t, 2H), 1.72 ppm (quint, 2H), 2.27 ppm (s, 3H), 2.56 ppm (t, 2H), 2.72-2.89 ppm (m, 4H), 3.57 ppm (s, 9H), 6.99-7.20 ppm (m, 4H).

(Synthesis of Raw Material 4)

Into a 100 mL flask, 10.00 of 3-mercaptopropyltrimethoxysilane, 5.30 g of styrene, 0.21 g of azobisisobutyronitrile, and 15 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-8) that was an objective product.

$^1$H-NMR (400 MHz): 0.75 ppm (t, 2H), 1.71 ppm (quint, 2H), 2.55 ppm (t, 2H), 2.76 ppm (t, 2H), 2.88 ppm (t, 2H), 3.57 ppm (s, 9H), 7.10-7.35 ppm (m, 5H).

(Synthesis of Raw Material 5)

Into a 100 mL flask, 5.31 g of vinyltrimethoxysilane, 5.02 g of 4-methoxybenzenethiol, 0.15 g of azobisisobutyronitrile, and 15 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-9) that was an objective product.

$^1$H-NMR (400 MHz): 0.99 ppm (t, 2H), 2.91 ppm (t, 2H), 3.55 ppm (s, 9H), 3.78 ppm (s, 3H), 6.78-7.35 ppm (m, 4H).

(Synthesis of Raw Material 6)

Into a 100 mL flask, 5.31 g of vinyltrimethoxysilane, 5.02 g of 2-methoxybenzenethiol, 0.15 g of azobisisobutyronitrile, and 15 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-10) that was an objective product.

$^1$H-NMR (400 MHz): 1.04 ppm (t, 2H), 2.99 ppm (t, 2H), 3.57 ppm (s, 9H), 3.88 ppm (s, 3H), 6.83-7.27 ppm (m, 4H).

(Synthesis of Raw Material 7)

Into a 100 mL flask, 10.00 g of 3-mercaptopropyltriethoxysilane, 6.80 of safrole, 0.17 g of azobisisobutyronitrile, and 17.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-21) below that was an objective product.

$^1$H-NMR (400 MHz): 0.74 ppm (t, 2H), 1.22 ppm (t, 9H), 1.70 ppm (quint, 2H), 1.85 ppm (quint, 2H), 2.51 ppm (quint, 2H), 2.63 ppm (t, 2H), 3.81 ppm (q, 6H), 5.92 ppm (s, 2H), 6.62-6.75 ppm (m, 3H).

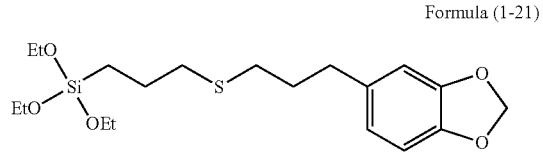 [SMILES: CCO[Si](CCCSCCCc1ccc2c(c1)OCO2)(OCC)OCC]

Formula (1-21)

(Synthesis of Raw Material 8)

Into a 100 mL flask, 10.00 g of 3-mercaptopropyltriethoxysilane, 6.89 g of 5-norbornene-2,3-dicarboxylic anhydride, 0.17 g of azobisisobutyronitrile, and 17.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-22) below that was an objective product.

$^1$H-NMR (400 MHz): 0.64 ppm (t, 2H), 1.14 ppm (t, 9H), 1.51-1.83 ppm (m, 6H), 2.44-2.69 ppm (m, 5H), 3.47-3.59 ppm (m, 2H), 3.73 ppm (q, 6H).

Formula (1-22)

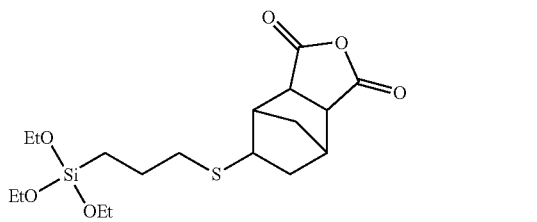

(Synthesis of Raw Material 9)

Into a 100 mL flask, 10.00 g of 3-mercaptopropyltriethoxysilane, 4.79 g of 3,4-dihydro-2-methoxy-2H-pyran, 0.13 g of azobisisobutyronitrile, and 15.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-23) below that was an objective product.

$^1$H-NMR (400 MHz): 0.74 ppm (t, 2H), 1.23 ppm (t, 9H), 1.69-2.05 ppm (m, 9H), 2.52-2.58 ppm (m, 3H), 3.49 ppm (s, 3H), 3.79-3.85 ppm (m, 7H), 4.00-4.05 ppm (m, 1H), 4.95 ppm (t, 1H).

Formula (1-23)

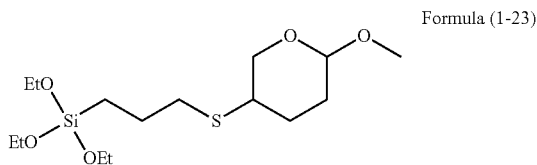 [SMILES: CCO[Si](CCCSC1CCC(OC)OC1)(OCC)OCC]

(Synthesis of Raw Material 10)

Into a 100 mL flask, 10.00 of 3-mercaptopropyltriethoxysilane, 5.38 g of 2-vinyloxytetrahydropyran, 0.17 g of azobisisobutyronitrile, and 16.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-24) below that was an objective product.

$^1$H-NMR (400 MHz): 0.74 ppm (t, 2H), 1.23 ppm (t, 9H), 1.54-1.84 ppm (m, 8H), 2.59 ppm (t, 2H), 2.73 ppm (t, 2H), 3.50-3.62 ppm (m, 2H), 3.79-3.92 ppm (m, 8H), 4.64 ppm (t, 1H).

Formula (1-24)

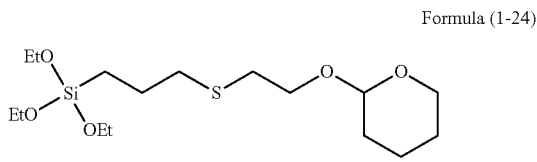 [SMILES: CCO[Si](CCCSCCOC1CCCCO1)(OCC)OCC]

(Synthesis of Raw Material 11)

Into a 100 mL flask, 10.00 g of 3-mercaptopropyltriethoxysilane, 5.46 g of allylethyl carbonate, 0.17 g of azobisisobutyronitrile, and 16.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-25) below that was an objective product.

$^1$H-NMR (400 MHz): 0.74 ppm (t, 2H), 1.24 ppm (t, 9H), 1.31 ppm (t, 3H), 1.70 ppm (quint, 2H), 1.95 ppm (quint, 2H), 2.54 ppm (t, 2H), 2.59 ppm (t, 2H), 3.82 ppm (q, 6H), 4.17-4.24 ppm (m, 4H).

Formula (1-25)

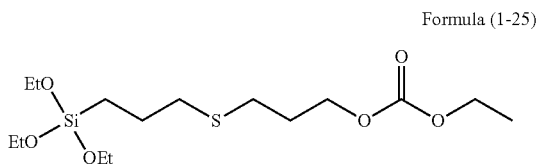 [SMILES: CCOC(=O)OCCCSCCC[Si](OCC)(OCC)OCC]

(Synthesis of Raw Material 12)

Into a 100 mL flask, 10.00 g of 3-mercaptopropyltriethoxysilane, 2.44 g of allyl alcohol, 0.17 g of azobisisobutyronitrile, and 13.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-26) below that was an objective product.

$^1$H-NMR (400 MHz): 0.64 ppm (t, 2H), 1.13 ppm (t, 9H), 1.55 ppm (quint, 2H), 1.62 ppm (quint, 2H), 2.45-2.50 ppm (m, 4H), 3.43 ppm (q, 2H), 3.73 ppm (q, 6H).

Formula (1-26)

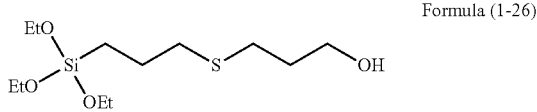 [SMILES: CCO[Si](CCCSCCCO)(OCC)OCC]

(Synthesis of Raw Material 13)

Into a 100 mL flask, 10.00 g of 3-mercaptopropyltriethoxysilane, 3.61 g of 4-penten-2-ol, 0.17 g of azobisisobutyronitrile, and 14.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-27) below that was an objective product.

$^1$H-NMR (400 MHz): 0.65 ppm (t, 2H), 1.01 ppm (d, 2H), 1.14 ppm (t, 9H), 1.36 ppm (q, 2H), 1.44-1.61 ppm (m, 4H), 2.40-2.51 ppm (m, 4H), 3.56 ppm (m, 1H), 3.73 ppm (q, 6H).

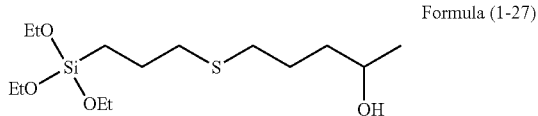 [SMILES: CCO[Si](CCCSCCCC(C)O)(OCC)OCC]

Formula (1-27)

(Synthesis of Raw Material 14)

Into a 100 mL flask, 10.00 g of 3-mercaptopropyltriethoxysilane, 3.61 g of 2-methyl-3-buten-2-ol, 0.17 g of azobisisobutyronitrile, and 14.00 g of methyl ethyl ketone were charged and nitrogen was blown to purge the inside of the reaction vessel with nitrogen. Then, the reaction vessel was immersed in an oil bath and the temperature of the reaction mixture was elevated from room temperature to 90° C. to subject the reaction mixture to heating-reflux for 7 hours. After the completion of the reaction, using a rotary evaporator, methyl ethyl ketone as the solvent was removed under reduced pressure to obtain a compound of Formula (1-28) below that was an objective product.

$^1$H-NMR (400 MHz): 0.74 ppm (t, 2H), 1.21 ppm (s, 6H), 1.24 ppm (t, 9H), 1.67-1.78 ppm (m, 4H), 2.55-2.63 ppm (m, 4H), 3.82 ppm (q, 6H).

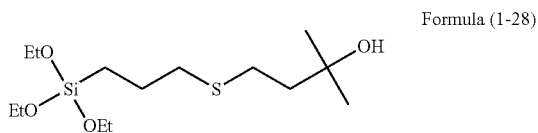 [SMILES: CCO[Si](CCCSCCC(C)(C)O)(OCC)OCC]

Formula (1-28)

Synthesis Example 1

0.18 g of a compound of Formula (1-1), 13.54 g of tetraethoxysilane, 1.98 g of phenyltrimethoxysilane, 4.37 g of methyltriethoxysilane, and 30.11 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.60 g of ion-exchanged water was added. The resultant reaction mixture was subjected to the reaction for 240 minutes and the resultant reaction solution was cooled down to room temperature. Then, to the reaction solution, 21.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 0.50% by mole and a ratio of a sulfur atom to a silicon atom in a polyorganosiloxane that was the obtained hydrolysis-condensation product corresponded to the ratio.

Synthesis Example 2

1.75 g of a compound of Formula (1-1), 13.54 g of tetraethoxysilane, 1.98 g of phenyltrimethoxysilane, 3.58 g of methyltriethoxysilane, and 31.32 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.85 g of ion-exchanged water was added. The resultant reaction mixture was subjected to the reaction for 240 minutes and the resultant reaction solution was cooled down to room temperature. Then, to the reaction solution, 21.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,200. The hydrolysis-condensation product corresponded to the whole silicon atom-containing compound as a raw material in which a ratio of a sulfur atom to a silicon atom was 4.68% by mole and a ratio of a sulfur atom to a silicon atom in a polyorganosiloxane that was the obtained hydrolysis-condensation product corresponded to the ratio.

Synthesis Example 3

0.144 g of a compound of Formula (1-3), 15.05 g of tetraethoxysilane, 0.99 g of phenyltrimethoxysilane, 5.94 g of methyltriethoxysilane, and 33.19 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 7.30 g of ion-exchanged water was added. The resultant reaction mixture was subjected to the reaction for 240 minutes and the resultant reaction solution was cooled down to room temperature. Then, to the reaction solution, 22.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 0.50% by mole and a ratio of a sulfur atom to a silicon atom in a polyorganosiloxane that was the obtained hydrolysis-condensation product corresponded to the ratio.

Synthesis Example 4

1.14 g of a compound of Formula (1-3), 12.16 g of tetraethoxysilane, 0.02 g of phenyltrimethoxysilane, 4.80 g of methyltriethoxysilane, and 27.17 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 5.90 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 4.90% by mole and a ratio of a sulfur atom to a silicon atom in a polyorganosiloxane that was the obtained hydrolysis-condensation product corresponded to the ratio.

Synthesis Example 5

0.36 g of a compound of Formula (1-4), 12.50 g of tetraethoxysilane, 0.99 g of phenyltrimethoxysilane, 5.17 g of methyltriethoxysilane, and 28.53 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.21 g of ion-exchanged water was added. The resultant reaction mixture was subjected to the reaction for 240 minutes and the resultant reaction solution was cooled down to room temperature. Then, to the reaction solution, 19.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 1,800. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 6

0.30 g of a compound of Formula (1-8), 13.54 g of tetraethoxysilane, 0.99 g of phenyltrimethoxysilane, 5.17 g of methyltriethoxysilane, and 30.00 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 7

0.29 g of a compound of Formula (1-9), 13.54 g of tetraethoxysilane, 0.99 g of phenyltrimethoxysilane, 5.17 g of methyltriethoxysilane, and 29.99 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 8

0.29 g of a compound of Formula (1-10), 13.54 g of tetraethoxysilane, 0.99 g of phenyltrimethoxysilane, 5.17 g of methyltriethoxysilane, and 29.99 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 9

0.50 g of a compound of Formula (1-21), 18.23 g of tetraethoxysilane, 0.99 g of phenyltrimethoxysilane, 5.57 g of methyltriethoxysilane, and 37.94 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 8.32 g of ion-exchanged water was added. The resultant reaction mixture was subjected to the reaction for 240 minutes and the resultant reaction solution was cooled down to room temperature. Then, to the reaction solution, 25.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 1,800. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 10

0.40 g of a compound of Formula (1-22), 14.58 g of tetraethoxysilane, 0.99 g of phenyltrimethoxysilane, 4.28 g of methyltriethoxysilane, and 30.38 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 11

0.35 g of a compound of Formula (1-23), 14.58 g of tetraethoxysilane, 1.98 g of phenyltrimethoxysilane, 3.39 g of methyltriethoxysilane, and 30.46 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 12

0.37 g of a compound of Formula (1-24), 14.58 g of tetraethoxysilane, 1.98 g of phenyltrimethoxysilane, 3.39 g of methyltriethoxysilane, and 30.48 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 13

0.37 g of a compound of Formula (1-25), 14.58 g of tetraethoxysilane, 1.98 g of phenyltrimethoxysilane, 3.39 g of methyltriethoxysilane, and 30.48 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 1,900. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 14

0.30 g of a compound of Formula (1-26), 14.58 g of tetraethoxysilane, 1.98 g of phenyltrimethoxysilane, 3.39 g of methyltriethoxysilane, and 30.38 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

An alkoxysilane compound having a primary alcohol terminal forms a ring structure in the molecule thereof during the synthesis or the purification thereof by a reaction between an alcohol moiety and an alkoxysilane moiety and this ring formation reaction is extremely difficult to be controlled. However, in a compound (1-26) with an interposed sulfide bond, as the result of an analysis such as NMR, the formation Synthesis Example 15

0.32 g of a compound of Formula (1-27), 14.58 g of tetraethoxysilane, 0.99 g of phenyltrimethoxysilane, 4.28 g of methyltriethoxysilane, and 30.27 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Synthesis Example 16

0.32 g of a compound of Formula (1-28), 14.58 g of tetraethoxysilane, 0.99 g of phenyltrimethoxysilane, 4.28 g of methyltriethoxysilane, and 30.27 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.66 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 1.00% by mole and a ratio of a sulfur atom to a silicon atom in a polyorganosiloxane that was the obtained hydrolysis-condensation product corresponded to the ratio.

Comparative Synthesis Example 1

0.17 g of a compound of Formula (1-1), 13.54 g of tetraethoxysilane, 1.98 g of phenyltrimethoxysilane, 4.37 g of methyltriethoxysilane, and 30.10 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.60 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,200. The hydrolysis-condensation product corresponded to the whole silicon atom-containing compound as a raw material in which a ratio of a sulfur atom to a silicon atom was 0.47% by mole and a ratio of a sulfur atom to a silicon atom in a polyorganosiloxane that was the obtained hydrolysis-condensation product corresponded to the ratio.

Comparative Synthesis Example 2

1.79 g of a compound of Formula (1-1), 13.54 g of tetraethoxysilane, 1.98 g of phenyltrimethoxysilane, 3.57 g of methyltriethoxysilane, and 31.32 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.85 g of ion-exchanged water was added. The resultant reaction mixture was subjected to the reaction for 240 minutes and the resultant reaction solution was cooled down to room temperature. Then, to the reaction solution, 21.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,400. The hydrolysis-condensation product corresponded to the whole silicon atom-containing compound as a raw material in which a ratio of a sulfur atom to a silicon atom was 5.21% by mole and a ratio of a sulfur atom to a silicon atom in a polyorganosiloxane that was the obtained hydrolysis-condensation product corresponded to the ratio.

Comparative Synthesis Example 3

0.140 g of a compound of Formula (1-3), 15.01 g of tetraethoxysilane, 0.99 g of phenyltrimethoxysilane, 5.93 g of methyltriethoxysilane, and 33.11 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 7.28 g of ion-exchanged water was added. The resultant reaction mixture was subjected to the reaction for 240 minutes and the resultant reaction solution was cooled down to room temperature. Then, to the reaction solution, 22.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 1,900. The hydrolysis-condensation product corresponded to the whole silicon atom-containing compound as a raw material in which a ratio of a sulfur atom to a silicon atom was 0.49% by mole and a ratio of a sulfur atom to a silicon atom in a polyorganosiloxane that was the obtained hydrolysis-condensation product corresponded to the ratio.

Comparative Synthesis Example 4

1.29 g of a compound of Formula (1-3), 13.54 g of tetraethoxysilane, 5.35 g of methyltriethoxysilane, and 30.30 g of acetone were charged into a 100 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100. The hydrolysis-condensation product corresponded to the whole silicon atom-containing compound as a raw material in which a ratio of a sulfur atom to a silicon atom was 5.00% by mole and a ratio of a sulfur atom to a silicon atom in a polyorganosiloxane that was the obtained hydrolysis-condensation product corresponded to the ratio.

Comparative Synthesis Example 5

13.54 g of tetraethoxysilane, 1.19 g of phenyltrimethoxysilane, 5.17 g of methyltriethoxysilane, and 29.85 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,000.

Comparative Synthesis Example 6

13.54 g of tetraethoxysilane, 1.98 g of phenyltrimethoxysilane, 4.46 g of methyltriethoxysilane, and 29.97 g of acetone were charged into a 200 mL flask to be dissolved and the resultant reaction mixture was warmed while being stirred with a magnetic stirrer to be refluxed. Next, to the reaction mixture, an aqueous solution in which 0.01 g of hydrochloric acid was dissolved in 6.57 g of ion-exchanged water was added. The resultant reaction mixture was subjected to the reaction for 240 minutes and the resultant reaction solution was cooled down to room temperature. Then, to the reaction solution, 20.00 g of propylene glycol monomethyl ether acetate was added and ethanol that was a reaction by-product, water, and hydrochloric acid were distilled off under reduced pressure to obtain a solution of a hydrolysis-condensation product (polyorganosiloxane). The obtained polymer had a weight average molecular weight Mw measured by GPC in terms of polystyrene of 2,100.

Example 1

10.00 g of the polymer solution (polyorganosiloxane concentration: 29.58% by mass) obtained in Synthesis Example 1 was blended with 0.03 g of maleic acid, 5.31 g of ultrapure water, 0.01 g of benzyltriethylammonium chloride, 4.17 g of propylene glycol monomethyl ether acetate, 26.55 g of propylene glycol monomethyl ether, and 31.66 g of propylene glycol monoethyl ether to prepare a resist underlayer film material.

Example 2

10.00 g of the polymer solution (polyorganosiloxane concentration: 30.06% by mass) obtained in Synthesis Example 2 was blended with 0.03 g of maleic acid, 5.40 g of ultrapure water, 0.01 g of benzyltriethylammonium chloride, 4.57 g of propylene glycol monomethyl ether acetate, 26.98 g of propylene glycol monomethyl ether, and 32.18 g of propylene glycol monoethyl ether to prepare a resist underlayer film material.

Example 3

10.00 g of the polymer solution (polyorganosiloxane concentration: 28.87% by mass) obtained in Synthesis Example 3 was blended with 0.03 g of maleic acid, 5.18 g of ultrapure water, 0.01 g of benzyltriethylammonium chloride, 3.99 g of propylene glycol monomethyl ether acetate, 25.91 g of propylene glycol monomethyl ether, and 30.90 g of propylene glycol monoethyl ether to prepare a resist underlayer film material.

Example 4

10.00 g of the polymer solution (polyorganosiloxane concentration: 27.73% by mass) obtained in Synthesis Example 4 was blended with 0.03 g of maleic acid, 4.98 g of ultrapure water, 0.01 g of benzyltriethylammonium chloride, 3.44 g of propylene glycol monomethyl ether acetate, 29.68 g of propylene glycol monomethyl ether, and 31.29 g of propylene glycol monoethyl ether to prepare a resist underlayer film material.

Example 5

10.00 g of the polymer solution (polyorganosiloxane concentration: 30.97% by mass) obtained in Synthesis Example 5 was blended with 0.03 g of maleic acid, 5.36 g of ultrapure water, 0.01 g of benzyltriethylammonium chloride, 4.81 g of propylene glycol monomethyl ether acetate, 26.80 g of propylene glycol monomethyl ether, and 31.65 g of propylene glycol monoethyl ether to prepare a resist underlayer film material.

Example 6

10.00 g of the polymer solution (polyorganosiloxane concentration: 30.01% by mass) obtained in Synthesis Example 6 was blended with 0.03 g of maleic acid, 5.36 g of ultrapure water, 0.01 g of benzyltriethylammonium chloride, 4.61 g of propylene glycol monomethyl ether acetate, 26.80 g of propylene glycol monomethyl ether, and 32.15 g of propylene glycol monoethyl ether to prepare a resist underlayer film material.

Example 7

10.00 g of the polymer solution (polyorganosiloxane concentration: 29.05% by mass) obtained in Synthesis Example 7 was blended with 0.03 g of maleic acid, 5.18 g of ultrapure water, 0.01 g of benzyltriethylammonium chloride, 3.99 g of propylene glycol monomethyl ether acetate, 29.70 g of propylene glycol monomethyl ether, and 31.25 g of propylene glycol monoethyl ether to prepare a resist underlayer film material.

Example 8

10.00 g of the polymer solution (polyorganosiloxane concentration: 29.97% by mass) obtained in Synthesis Example 8 was blended with 0.03 g of maleic acid, 5.35 g of ultrapure water, 0.01 g of benzyltriethylammonium chloride, 4.39 g of propylene glycol monomethyl ether acetate, 26.64 g of propylene glycol monomethyl ether, and 31.85 g of propylene glycol monoethyl ether to prepare a resist underlayer film material.

Example 9

10.00 g of the polymer solution (polyorganosiloxane concentration: 29.42% by mass) obtained in Synthesis Example 9 was blended with 0.03 g of maleic acid, 5.31 g of ultrapure water, 0.01 g of benzyltriethylammonium chloride, 4.26 g of propylene glycol monomethyl ether acetate, 26.41 g of propylene glycol monomethyl ether, and 32.44 g of propylene glycol monoethyl ether to prepare a resist underlayer film material.

Example 10

10.00 g of the polymer solution (polyorganosiloxane concentration: 28.78% by mass) obtained in Synthesis Example 10 was blended with 0.03 g of maleic acid, 5.17 g of ultrapure water, 0.01 g of benzyltriethylammonium chloride, 3.95 g of propylene glycol monomethyl ether acetate, 25.83 g of propylene glycol monomethyl ether, and 31.77 g of propylene glycol monoethyl ether to prepare a resist underlayer film material.

Example 11

10.00 g of the polymer solution (polyorganosiloxane concentration: 29.59% by mass) obtained in Synthesis Example 11 was blended with 0.03 g of maleic acid, 5.31 g of ultrapure water, 0.01 g of benzyltriethylammonium chloride, 4.34 g of propylene glycol monomethyl ether acetate, 26.56 g of propylene glycol monomethyl ether, and 32.50 g of propylene glycol monoethyl ether to prepare a resist underlayer film material.

Example 12

10.00 g of the polymer solution (polyorganosiloxane concentration: 28.92% by mass) obtained in Synthesis Example 12 was blended with 0.03 g of maleic acid, 5.19 g of ultrapure water, 0.01 g of benzyltriethylammonium chloride, 4.02 g of propylene glycol monomethyl ether acetate, 25.96 g of propylene glycol monomethyl ether, and 32.77 g of propylene glycol monoethyl ether to prepare a resist underlayer film material.

Example 13

10.00 g of the polymer solution (polyorganosiloxane concentration: 28.52% by mass) obtained in Synthesis Example 13 was blended with 0.03 g of maleic acid, 5.12 g of ultrapure water, 0.01 g of benzyltriethylammonium chloride, 3.82 g of propylene glycol monomethyl ether acetate, 25.60 g of propylene glycol monomethyl ether, and 31.45 g of propylene glycol monoethyl ether to prepare a resist underlayer film material.

Example 14

10.00 g of the polymer solution (polyorganosiloxane concentration: 30.34% by mass) obtained in Synthesis Example 14 was blended with 0.03 g of maleic acid, 5.45 g of ultrapure water, 0.01 g of benzyltriethylammonium chloride, 4.71 g of propylene glycol monomethyl ether acetate, 27.23 g of propylene glycol monomethyl ether, and 33.34 g of propylene glycol monoethyl ether to prepare a resist underlayer film material.

Example 15

10.00 g of the polymer solution (polyorganosiloxane concentration: 29.69% by mass) obtained in Synthesis Example 15 was blended with 0.03 g of maleic acid, 5.33 g of ultrapure water, 0.01 g of benzyltriethylammonium chloride, 4.39 g of propylene glycol monomethyl ether acetate, 26.65 g of propylene glycol monomethyl ether, and 30.90 g of propylene glycol monoethyl ether to prepare a resist underlayer film material.

Example 16

10.00 g of the polymer solution (polyorganosiloxane concentration: 28.75% by mass) obtained in Synthesis Example 16 was blended with 0.03 g of maleic acid, 5.16 g of ultrapure water, 0.01 g of benzyltriethylammonium chloride, 3.93 g of propylene glycol monomethyl ether acetate, 25.80 g of propylene glycol monomethyl ether, and 31.85 g of propylene glycol monoethyl ether to prepare a resist underlayer film material.

Example 17

10.00 g of the polymer solution (polyorganosiloxane concentration: 29.58% by mass) obtained in Synthesis Example 1 was blended with 0.03 g of maleic acid, 5.31 g of ultrapure water, 0.01 g of N-(3-triethoxysilylpropyl)-4,5-dihydroimidazole, 4.17 g of propylene glycol monomethyl ether acetate, 26.55 g of propylene glycol monomethyl ether, and 31.66 g of propylene glycol monoethyl ether to prepare a resist underlayer film material.

Comparative Example 1

10.00 g of the polymer solution (polyorganosiloxane concentration: 30.02% by mass) obtained in Comparative Synthesis Example 1 was blended with 0.03 g of maleic acid, 5.39 g of ultrapure water, 0.01 g of benzyltriethylammonium chloride, 4.55 g of propylene glycol monomethyl ether acetate, 26.95 g of propylene glycol monomethyl ether, and 32.13 g of propylene glycol monoethyl ether to prepare a resist underlayer film material.

Comparative Example 2

10.00 g of the polymer solution (polyorganosiloxane concentration: 28.12% by mass) obtained in Comparative Synthesis Example 2 was blended with 0.03 g of maleic acid, 5.05 g of ultrapure water, 0.01 g of benzyltriethylammonium chloride, 3.63 g of propylene glycol monomethyl ether acetate, 25.24 g of propylene glycol monomethyl ether, and 30.10 g of propylene glycol monoethyl ether to prepare a resist underlayer film material.

Comparative Example 3

10.00 g of the polymer solution (polyorganosiloxane concentration: 29.67% by mass) obtained in Comparative Synthesis Example 3 was blended with 0.03 g of maleic acid, 5.33 g of ultrapure water, 0.01 g of benzyltriethylammonium chloride, 4.38 g of propylene glycol monomethyl ether acetate, 26.63 g of propylene glycol monomethyl ether, and 31.76 g of propylene glycol monoethyl ether to prepare a resist underlayer film material.

Comparative Example 4

10.00 g of the polymer solution (polyorganosiloxane concentration: 27.60% by mass) obtained in Comparative Synthesis Example 4 was blended with 0.03 g of maleic acid, 4.95 g of ultrapure water, 0.01 g of benzyltriethylammonium chloride, 3.38 g of propylene glycol monomethyl ether acetate, 24.77 g of propylene glycol monomethyl ether, and 29.54 g of propylene glycol monoethyl ether to prepare a resist underlayer film material.

Comparative Example 5

10.00 g of the polymer solution (polyorganosiloxane concentration: 29.76% by mass) obtained in Comparative Example 5 was blended with 0.03 g of maleic acid, 5.34 g of ultrapure water, 4.42 g of propylene glycol monomethyl ether acetate, 26.71 g of propylene glycol monomethyl ether, and 31.86 g of propylene glycol monoethyl ether to prepare a resist underlayer film material.

Comparative Example 6

10.00 g of the polymer solution (polyorganosiloxane concentration: 29.76% by mass) obtained in Comparative Synthesis Example 5 was blended with 0.03 g of maleic acid, 5.34 g of ultrapure water, 0.01 g of benzyltriethylammonium chloride, 4.42 g of propylene glycol monomethyl ether acetate, 26.71 g of propylene glycol monomethyl ether, and 31.86 g of propylene glycol monoethyl ether to prepare a resist underlayer film material.

Comparative Example 7

10.00 g of the polymer solution (polyorganosiloxane concentration: 29.23% by mass) obtained in Comparative Synthesis Example 6 was blended with 0.03 g of maleic acid, 5.25 g of ultrapure water, 4.17 g of propylene glycol monomethyl ether acetate, 26.24 g of propylene glycol monomethyl ether, and 31.29 g of propylene glycol monoethyl ether to prepare a resist underlayer film material.

Comparative Example 8

10.00 g of the polymer solution (polyorganosiloxane concentration: 29.23% by mass) obtained in Comparative Synthesis Example 6 was blended with 0.03 g of maleic acid, 5.25 g of ultrapure water, 0.01 g of benzyltriethylammonium chloride, 4.17 g of propylene glycol monomethyl ether acetate, 26.24 g of propylene glycol monomethyl ether, and 31.29 g of propylene glycol monoethyl ether to prepare a resist underlayer film material.

(Solvent Resistance Test)

The resist underlayer film forming composition was applied on a silicon wafer by a spin coating method and was baked on a hot plate of 150° C. for 1 minute to form a resist underlayer film. Then, the resist underlayer film was immersed in propylene glycol monomethyl ether acetate used as a solvent for an overcoat resist composition for 1 minute. When the change in the film thickness of the resist underlayer film between before and after the immersion was 1 nm or less, the evaluation was made as "advantageous" with a mark of "○" in Table 1.

TABLE 1

| Result of solvent resistance test | |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |
| Example 12 | ○ |
| Example 13 | ○ |
| Example 14 | ○ |
| Example 15 | ○ |
| Example 16 | ○ |
| Example 17 | ○ |
| Comparative Example 1 | ○ |
| Comparative Example 2 | ○ |
| Comparative Example 3 | ○ |
| Comparative Example 4 | ○ |
| Comparative Example 5 | x |
| Comparative Example 6 | ○ |
| Comparative Example 7 | x |
| Comparative Example 8 | ○ |

(Optical Constants)

The resist underlayer film forming composition was applied on a silicon wafer using a spinner. The composition was heated on a hot plate at 240° C. for 1 minute to form a resist underlayer film (film thickness: 0.09 μm). Then, the refractive index (n value) and the optical absorptivity (k value; also called the attenuation coefficient) at a wavelength of 193 nm of the resist underlayer film were measured using a spectro-ellipsometer (VUV-VASE VU-302; manufactured by J. A. Woollam Corporation). The result of the measurement is shown in Table 2.

TABLE 2

| | Refractive index n and optical absorptivity k | |
|---|---|---|
| | Refractive index n (Wavelength 193 nm) | Optical absorptivity k (Wavelength 193 nm) |
| Example 1 | 1.66 | 0.18 |
| Example 2 | 1.67 | 0.18 |
| Example 3 | 1.61 | 0.13 |
| Example 4 | 1.60 | 0.13 |
| Example 5 | 1.61 | 0.12 |
| Example 6 | 1.61 | 0.12 |

TABLE 2-continued

Refractive index n and optical absorptivity k

|  | Refractive index n (Wavelength 193 nm) | Optical absorptivity k (Wavelength 193 nm) |
|---|---|---|
| Example 7 | 1.61 | 0.12 |
| Example 8 | 1.61 | 0.12 |
| Example 9 | 1.58 | 0.12 |
| Example 10 | 1.61 | 0.12 |
| Example 11 | 1.67 | 0.18 |
| Example 12 | 1.67 | 0.19 |
| Example 13 | 1.68 | 0.18 |
| Example 14 | 1.67 | 0.18 |
| Example 15 | 1.61 | 0.12 |
| Example 16 | 1.60 | 0.12 |
| Example 17 | 1.66 | 0.18 |
| Comparative Example 1 | 1.66 | 0.18 |
| Comparative Example 2 | 1.67 | 0.18 |
| Comparative Example 3 | 1.61 | 0.13 |
| Comparative Example 4 | 1.60 | 0.12 |
| Comparative Example 5 | 1.60 | 0.13 |
| Comparative Example 6 | 1.60 | 0.14 |
| Comparative Example 7 | 1.66 | 0.18 |
| Comparative Example 8 | 1.67 | 0.19 |

(Measurement of Dry Etching Rate)

Etchers and etching gases used in the measurement of dry etching rates were as follows. As the etcher, ES401 (trade name; manufactured by Nippon Scientific Co., Ltd.) was used and etching was performed with a $CF_4$ gas. As the etcher, RIE-10NR (trade name; manufactured by Samco, Inc.) was used and etching was performed with an $O_2$ gas.

Each of the solutions of resist underlayer film forming compositions prepared in Example 1 to Example 17 and Comparative Example 1 to Comparative Example 8 was applied on a silicon wafer using a spinner. The composition solution was heated on a hot plate at 240° C. for 1 minute to form a resist underlayer film. The etching rate was measured using each etching gas. For a film thickness of the resist underlayer film of 0.20 μm, the etching rate was measured using a $CF_4$ gas as the etching gas, and for a film thickness of the resist underlayer film of 0.08 μm, the etching rate was measured using an $O_2$ gas as the etching gas.

In the same manner, a photoresist solution (trade name: UV113; manufactured by Shipley Company, L.L.C.) was applied on a silicon wafer using a spinner to form each of a resist film having a thickness of 0.20 μm and a resist film having a thickness of 0.08 μm. Using a $CF_4$ gas and an $O_2$ gas as the etching gas, the dry etching rate was measured. Then, the dry etching rate of each resist underlayer film was compared with that of the resist film. The result is shown in Table 3. The rate ratio is a dry etching rate ratio of (resist underlayer film)/(resist).

TABLE 3

Dry etching rate ratio

|  | $CF_4$ gas | $O_2$ gas |
|---|---|---|
| Example 1 | 1.74 | 0.02 |
| Example 2 | 1.85 | 0.02 |
| Example 3 | 1.73 | 0.02 |
| Example 4 | 1.84 | 0.02 |
| Example 5 | 1.79 | 0.02 |
| Example 6 | 1.74 | 0.02 |
| Example 7 | 1.78 | 0.02 |
| Example 8 | 1.78 | 0.02 |
| Example 9 | 1.80 | 0.02 |
| Example 10 | 1.85 | 0.02 |
| Example 11 | 1.82 | 0.02 |
| Example 12 | 1.84 | 0.02 |
| Example 13 | 1.79 | 0.02 |
| Example 14 | 1.75 | 0.02 |
| Example 15 | 1.76 | 0.02 |
| Example 16 | 1.76 | 0.02 |
| Example 17 | 1.74 | 0.02 |
| Comparative Example 1 | 1.73 | 0.02 |
| Comparative Example 2 | 1.86 | 0.02 |
| Comparative Example 3 | 1.73 | 0.02 |
| Comparative Example 4 | 1.85 | 0.02 |
| Comparative Example 5 | 1.69 | 0.02 |
| Comparative Example 6 | 1.65 | 0.02 |
| Comparative Example 7 | 1.70 | 0.02 |
| Comparative Example 8 | 1.68 | 0.02 |

(Preparation of Organic Underlayer Film)

Into a 200 mL flask, 16.5 g of acenaphthylene, 1.5 g of 4-hydroxystyrene, and 60 g of 1,2-dichloroethane as a solvent were charged. Thereto, 1 g of trifluoro boron as a polymerization initiator was added and the resultant reaction mixture was heated to 60° C. and was subsequently subjected to the reaction for 24 hours. To this solution, 1 L of methanol and 500 g of water were added and the resultant mixture was subjected to re-precipitation purification, followed by filtering and subsequent drying the resultant white solid to obtain 11 g of a white polymer.

The obtained polymer was subjected to $^{13}C$, $^{1}H$-NMR, and a GPC measurement and the constitution there was acenaphthylene:4-hydroxystyrene=86:14. Mw=6,000, Mw/Mn=1.5.

To 10 g of the obtained polymer, 1.0 g of tetramethoxymethyl glycoluril (trade name: POWDERLINK 1174; manufactured by Mitsui Cytec Ltd.), 0.01 g of para-toluenesulfonic acid as a crosslinking catalyst, and 0.03 g of MEGAFAC R-30 (trade name; manufactured by Dainippon Ink and Chemicals, Inc.) as a surfactant were added and the resultant mixture was dissolved in 101.57 g of propylene glycol monomethyl ether acetate and 25.39 g of propylene glycol monomethyl ether. Thereafter, the resultant solution was filtered using a polyethylene microfilter having a pore diameter of 0.10 μm and was further filtered using a polyethylene microfilter having a pore diameter of 0.05 μm to prepare a solution of a resist underlayer film forming composition to be used for a lithography process by a multilayer film.

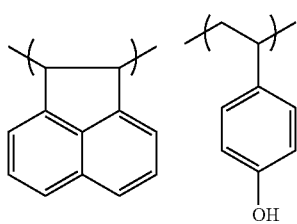

Formula (3-1)

(Resist Patterning Evaluation)

An organic underlayer film (layer A) forming composition containing the above polymer (3-1) was applied on a silicon wafer and the composition was heated on a hot plate at 240° C. for 1 minute to obtain an organic underlayer film (layer A) having a film thickness of 250 nm. On the organic underlayer film (layer A), each of the Si-containing resist underlayer film (layer B) compositions obtained in Example 1 to Example 17 and Comparative Examples 1 to 4, Comparative Example 6, and Comparative Example 8 was applied and the composition was heated on a hot plate at 240° C. for 1 minute to obtain a Si-containing resist underlayer film (layer B) having a film thickness of 80 nm. On the resist underlayer film (layer B), a commercially available photoresist solution (trade name: PAR855; manufactured by Sumitomo Chemical Co., Ltd.) was applied by a spinner and the solution was heated on a hot plate at 100° C. for 1 minute to form a photoresist film (layer C) having a film thickness of 150 nm.

The patterning of the resist was performed using a PAS5500/1100 scanner (manufactured by ASML Holding N.V.; wavelength: 193 nm, NA, σ: 035, 0.89/0.59 (Dipole)).

The target was a photoresist after the development having a line width and a width between lines both of 0.08 μm, which is a so-called line and space (dense line), and the exposure was performed through a mask set to have 9 lines. Thereafter, the resist pattern was baked on a hot plate at 105° C. for 60 seconds, was cooled down, and was then developed by a 60-second single paddle-type process according to an industrial standard with a 2.38% tetramethylammonium hydroxide developer.

With respect to the resist pattern skirt shape after the lithography was performed, a shape having a straight line was evaluated as "advantageous" and a shape having an undercut (tapering of bottom portion), a footing (spreading of bottom portion), or a pattern collapse was evaluated as "disadvantageous".

TABLE 4

Resist shape evaluation

| | Resist skirt shape |
|---|---|
| Example 1 | Advantageous |
| Example 2 | Advantageous |
| Example 3 | Advantageous |
| Example 4 | Advantageous |
| Example 5 | Advantageous |
| Example 6 | Advantageous |
| Example 7 | Advantageous |
| Example 8 | Advantageous |
| Example 9 | Advantageous |
| Example 10 | Advantageous |
| Example 11 | Advantageous |
| Example 12 | Advantageous |
| Example 13 | Advantageous |
| Example 14 | Advantageous |
| Example 15 | Advantageous (partial footing) |

TABLE 4-continued

Resist shape evaluation

| | Resist skirt shape |
|---|---|
| Example 16 | Advantageous |
| Example 17 | Advantageous |
| Comparative Example 1 | Undercut shape |
| Comparative Example 2 | Footing shape |
| Comparative Example 3 | Footing shape |
| Comparative Example 4 | Undercut shape |
| Comparative Example 6 | Footing shape |
| Comparative Example 8 | Undercut shape |

The resist underlayer film obtained from the resist underlayer film forming composition according to the present invention has a satisfactorily high dry etching rate relative to a photoresist film. Examples 1 to 17 enhanced the etching rate by a fluorine-based gas in comparison with Comparative Examples 5 to 8, so that a resist pattern existing as an upper layer of the resist underlayer film of the present specification can exactly be transferred to the resist underlayer film of the present specification.

In Examples 1 to 17, the etching resistance against an oxygen gas was the same as that in Comparative Examples 5 to 8, so that these Examples have satisfactorily high function as a hard mask for processing an organic underlayer film or a substrate as further underlayers of the resist underlayer film of the present specification.

When comparing Examples 1, 2, and 17 with Comparative Examples 1, 2, and 8, although the refractive index n and the optical absorptivity k had the same values as each other, while in Comparative Examples 1 and 8, the resist shape was an undercut shape, and in Comparative Example 2, the resist shape was a footing shape, in Examples 1, 2, and 17, as the resist shape, a straight shape was obtained, so that by varying the introduced amount of a hexa-functional sulfide-containing monomer, the resist shape can be controlled.

Although Examples 11 to 13 using an alcohol protective-type polymer and Example 14 and Comparative Example 8 using a polymer having a primary alcohol terminal had the same values of the refractive index n and the optical absorptivity k as each other, while in Comparative Example 8, the resist shape was undercut, in Examples 11 to 14, as the resist shape, a straight shape was obtained.

Furthermore, when comparing Examples 3 to 8, Examples 9 to 10, and Examples 15 to 16 with Comparative Examples 3, 4, and 6, although the refractive index n and the optical absorptivity k were in the same values, by varying the introduced amount of a sulfide-containing monomer, the pattern shape could be controlled. When the introduced amount of a sulfide-containing monomer was an introduced amount by which the ratio of a sulfur atom to a silicon atom in the whole silicon atom-containing compound in the resist underlayer film forming composition became 0 to 0.49% by mole (Comparative Examples 3, 6, and 8), although the resist shape was a footing shape, by varying the introduced amount of a sulfide-containing monomer (Examples 3 to 8, 9 to 10, and 15 to 16), the pattern became that in a straight shape, and by setting the introduced amount of a sulfide-containing monomer at an introduced amount by which the ratio of a sulfur atom to a silicon atom in the whole silicon atom-containing compound in the resist underlayer film forming composition became 5.0% by mole or more, the resist shape became an undercut shape (Comparative Examples 2 and 4). Therefore, it is apparent that by varying the introduced amount, the resist skirt shape can be controlled. As described above, it is possible to produce a resist underlayer film material exhibiting advantageous lithography characteristics in a wide range of the optical absorptivity (k value) at a wavelength of 193 nm.

The invention claimed is:

1. A resist underlayer film obtained by applying a resist underlayer film forming composition on a semiconductor substrate and baking the resultant coating, wherein the resist underlayer film forming composition comprises:
   at least one combination selected from a group consisting of:
   1) a hydrolyzable organosilane of Formula (1):

$[R^1{}_a Si(R^2)_{3-a}]_b R^3$   Formula (1)

where $R^3$ is an organic group containing a sulfide bond and being bonded to a silicon atom through a Si—C bond; $R^1$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^2$ is an alkoxy group, an acyloxy group, or a halogen atom; a is an integer of 0 or 1; and b is an integer of 1 or 2, and
   a silicon atom-containing compound of Formula (3):

$R^6{}_a Si(R^7)_{4-a}$   Formula (3)

where $R^6$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^7$ is an alkoxy group, an acyloxy group, or a halogen atom; and a is an integer of 0 to 3, wherein a is 0 in at least one silicon atom-containing compound of Formula (3),
   2) the hydrolyzable organosilane of Formula (1) and a silicon atom-containing compound of Formula (4):

$[R^8{}_c Si(R^9)_{3-c}]_2 Y_b$   Formula (4)

where $R^8$ is an alkyl group; $R^9$ is an alkoxy group, an acyloxy group, or a halogen atom; Y is an alkylene group or an arylene group; b is an integer of 0 or 1; and c is an integer of 0 or 1, wherein c is 0 in at least one silicon atom-containing compound of Formula (4), and
   3) the hydrolyzable organosilane of Formula (1), the silicon atom-containing compound of Formula (3), and the silicon atom-containing compound of Formula (4), wherein a is 0 in at least one silicon atom-containing compound of Formula (3) and/or wherein c is 0 in at least one silicon atom-containing compound of Formula (4),
   or a hydrolysis product of the combination, a hydrolysis-condensation product of the combination, or a mixture of the combinations, and
   wherein in the at least one combination, the ratio of a sulfur atom to a silicon atom is 0.5 to 4.9% by mole.

2. The resist underlayer film according to claim 1, wherein $R^3$ in Formula (1) has a sulfide bond moiety of Formula (2):

$R^4\text{—S—}R^5$   Formula (2)

where $R^4$ and $R^5$ are independently an alkyl group, an alkylene group, an aryl group, or an arylene group each of which is optionally substituted.

3. The resist underlayer film according to claim 1, the resist underlayer film forming composition further comprising, as a polymer, a hydrolysis-condensation product of the hydrolyzable organosilane of Formula (1) or a hydrolysis-condensation product of the hydrolyzable organosilane of Formula (1) with the silicon atom-containing compound of Formula (3).

4. The resist underlayer film according to claim 1, the resist underlayer film forming composition further comprising, as a hydrolysis catalyst, an acid.

5. The resist underlayer film according to claim 1, the resist underlayer film forming composition further comprising water.

6. A production method of a semiconductor device, the production method comprising:
   applying a resist underlayer film forming composition on a semiconductor substrate and baking the resultant coating to form a resist underlayer film;
   applying a composition for a resist on the resist underlayer film to form a resist film;
   exposing the resist film to light;
   developing the resist film after the exposure to obtain a resist pattern;
   etching the resist underlayer film according to the resist pattern; and
   fabricating the semiconductor substrate according to the patterned resist film and the patterned resist underlayer film,
   wherein the resist underlayer film forming composition comprises:
   at least one combination selected from a group consisting of:
   1) a hydrolyzable organosilane of Formula (1):

$[R_1{}^a Si(R^2)_{3-a}]_b R^3$   Formula (1)

where $R^3$ is an organic group containing a sulfide bond and being bonded to a silicon atom through a Si—C bond: $R^1$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond: $R^2$ is an alkoxy group, an acyloxy group, or a halogen atom: a is an integer of 0 or 1; and b is an integer of 1 or 2, and
   a silicon atom-containing compound of Formula (3):

$R^6{}_a Si(R^7)_{4-a}$   Formula (3)

where $R^6$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^7$ is an alkoxy group, an acyloxy group, or a halogen atom; and a is an integer of 0 to 3, wherein a is 0 in at least one silicon atom-containing compound of Formula (3),
   2) the hydrolyzable organosilane of Formula (1) and a silicon atom-containing compound of Formula (4):

$[R^8{}_c Si(R^9)_{3-c}]_2 Y_b$   Formula (4)

where $R^8$ is an alkyl group: $R^9$ is an alkoxy group, an acyloxy group, or a halogen atom; Y is an alkylene group or an arylene group; b is an integer of 0 or 1; and c is an integer of 0 or 1, wherein c is 0 in at least one silicon atom-containing compound of Formula (4), and 3) the hydrolyzable organosilane of Formula (1), the silicon atom-containing compound of Formula (3), and the silicon atom-containing compound of Formula (4), wherein a is 0 in at least one silicon atom-containing compound of Formula (3) and/or wherein c is 0 in at least one silicon atom-containing compound of Formula (4), or a hydrolysis product of the combination, a hydrolysis-condensation product of the combination, or a mixture of the combinations, and wherein in the at least one combination, the ratio of a sulfur atom to a silicon atom is 0.5 to 4.9% by mole.

7. The production method according to claim 6, wherein $R^3$ in Formula (1) has a sulfide bond moiety of Formula (2):

$$R^4\text{—}S\text{—}R^5 \qquad \text{Formula (2)}$$

where $R^4$ and $R^5$ are independently an alkyl group, an alkylene group, an aryl group, or an arylene group each of which is optionally substituted.

8. The production method according to claim 6, the resist underlayer film forming composition comprising, as a polymer, a hydrolysis-condensation product of the hydrolyzable organosilane of Formula (1) or a hydrolysis-condensation product of the hydrolyzable organosilane of Formula (1) with the silicon atom-containing compound of Formula (3).

9. The production method according to claim 6, the resist underlayer film forming composition further comprising, as a hydrolysis catalyst, an acid.

10. The production method according to claim 6, the resist underlayer film forming composition further comprising water.

11. A production method of a semiconductor device, the production method comprising:
forming an organic underlayer film on a semiconductor substrate;
applying, on the organic underlayer film, a resist underlayer film forming composition and baking the resultant coating to form a resist underlayer film;
applying, on the resist underlayer film, a composition for a resist to form a resist film;
exposing the resist film to light;
developing the resist film after the exposure to obtain a resist pattern;
etching the resist underlayer film according to the resist pattern;
etching the organic underlayer film according to the patterned resist underlayer film; and
fabricating the semiconductor substrate according to the patterned organic underlayer film,
wherein the resist underlayer film forming composition comprises:
at least one combination selected from a group consisting of:
1) a hydrolyzable organosilane of Formula (1):

$$[R^1{}_a Si(R^2)_{3-a}]_b R^3 \qquad \text{Formula (1)}$$

where $R^3$ is an organic group containing a sulfide bond and being bonded to a silicon atom through a Si—C bond: $R^1$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^2$ is an alkoxy group, an acyloxy group, or a halogen atom; a is an integer of 0 or 1; and b is an integer of 1 or 2, and a silicon atom-containing compound of Formula (3):

$$R^6{}_a Si(R^7)_{4-a} \qquad \text{Formula (3)}$$

where $R^6$ is an alkyl group, an aryl group, a halogenated alkyl group, a halogenated aryl group, or an alkenyl group, or is an organic group having an epoxy group, an acryloyl group, a methacryloyl group, a mercapto group, an amino group, or a cyano group and being bonded to a silicon atom through a Si—C bond; $R^7$ is an alkoxy group, an acyloxy group, or a halogen atom; and a is an integer of 0 to 3, wherein a is 0 in at least one silicon atom-containing compound of Formula (3), 2) the hydrolyzable organosilane of Formula (1) and a silicon atom-containing compound of Formula (4):

$$[R^8{}_c Si(R^9)_{3-c}]_2 Y_b \qquad \text{Formula (4)}$$

where $R^8$ is an alkyl group; $R^9$ is an alkoxy group, an acyloxy group, or a halogen atom; Y is an alkylene group or an arylene group; b is an integer of 0 or 1; and c is an integer of 0 or 1, wherein c is 0 in at least one silicon atom-containing compound of Formula (4), and 3) the hydrolyzable organosilane of Formula (1), the silicon atom-containing compound of Formula (3), and the silicon atom-containing compound of Formula (4), wherein a is 0 in at least one silicon atom-containing compound of Formula (3) and/or wherein c is 0 in at least one silicon atom-containing compound of Formula (4), or a hydrolysis product of the combination, a hydrolysis-condensation product of the combination, or a mixture of the combinations, and wherein in the at least one combination, the ratio of a sulfur atom to a silicon atom is 0.5 to 4.9% by mole.

12. The production method according to claim 11, wherein $R^3$ in Formula (1) has a sulfide bond moiety of Formula (2):

$$R^4\text{—}S\text{—}R^5 \qquad \text{Formula (2)}$$

where $R^4$ and $R^5$ are independently an alkyl group, an alkylene group, an aryl group, or an arylene group each of which is optionally substituted.

13. The production method according to claim 11, the resist underlayer film forming composition comprising, as a polymer, a hydrolysis-condensation product of the hydrolyzable organosilane of Formula (1) or a hydrolysis-condensation product of the hydrolyzable organosilane of Formula (1) with the silicon atom-containing compound of Formula (3).

14. The production method according to claim 11, the resist underlayer film forming composition further comprising, as a hydrolysis catalyst, an acid.

15. The production method according to claim 11, the resist underlayer film forming composition further comprising water.

* * * * *